(12) United States Patent
Ogura et al.

(10) Patent No.: US 9,634,128 B2
(45) Date of Patent: Apr. 25, 2017

(54) SEMICONDUCTOR DEVICE

(71) Applicant: Kabushiki Kaisha Toshiba, Minato-ku, Tokyo (JP)

(72) Inventors: Tsuneo Ogura, Kamakura Kanagawa (JP); Shinichiro Misu, Machida Tokyo (JP); Tomoko Matsudai, Shibuya Tokyo (JP); Norio Yasuhara, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/792,307

(22) Filed: Jul. 6, 2015

(65) Prior Publication Data
US 2015/0311326 A1 Oct. 29, 2015

Related U.S. Application Data

(63) Continuation-in-part of application No. 14/485,028, filed on Sep. 12, 2014, now abandoned.

(30) Foreign Application Priority Data

Mar. 17, 2014 (JP) .................................. 2014-053320
Mar. 16, 2015 (JP) .................................. 2015-052706

(51) Int. Cl.
*H01L 29/739* (2006.01)
*H01L 29/40* (2006.01)
(Continued)

(52) U.S. Cl.
CPC ...... *H01L 29/7395* (2013.01); *H01L 29/0649* (2013.01); *H01L 29/407* (2013.01);
(Continued)

(58) Field of Classification Search
CPC ............. H01L 27/0716; H01L 29/7395; H01L 29/407; H01L 29/66136; H01L 29/868;
(Continued)

(56) References Cited

U.S. PATENT DOCUMENTS 8,384,151 B2 2/2013 Pfirsch
8,531,857 B2 9/2013 Soeno et al.
(Continued)

FOREIGN PATENT DOCUMENTS

TW 200727471 A 7/2007
TW I304263 B 12/2008

OTHER PUBLICATIONS

Korean Office Action issued in Korean Application No. 10-2014-0087417 dated Nov. 27, 2015, with English Translation.
Taiwanese Office Action issued on Jan. 20, 2016 in counterpart Taiwanese patent application No. 103125364 and English translation thereof.

*Primary Examiner* — Cuong Q Nguyen
*Assistant Examiner* — Tong-Ho Kim
(74) *Attorney, Agent, or Firm* — White & Case LLP

(57) ABSTRACT

According to one embodiment, a semiconductor device includes a first electrode, a second electrode, a first semiconductor region of a first conductivity type, a second semiconductor region of a second conductivity type, an insulating region, and a third semiconductor region of the first conductivity type. The first semiconductor region is provided between the first electrode and the second electrode, and is in contact with the first electrode. The second semiconductor region is provided between the first semiconductor region and the second electrode. The second semiconductor region is in contact with the second electrode. The insulating region extends in a direction from the second electrode toward the first semiconductor region. The insulating region is in contact with the second electrode. The third semiconductor region is provided between the second semiconductor region and the insulating region.

11 Claims, 17 Drawing Sheets

(51) Int. Cl.
  *H01L 29/66* (2006.01)
  *H01L 29/868* (2006.01)
  *H01L 29/06* (2006.01)
  *H01L 29/16* (2006.01)
  *H01L 29/20* (2006.01)

(52) U.S. Cl.
  CPC .... *H01L 29/66136* (2013.01); *H01L 29/7391* (2013.01); *H01L 29/868* (2013.01); *H01L 29/1608* (2013.01); *H01L 29/2003* (2013.01)

(58) Field of Classification Search
  CPC ............ H01L 29/0649; H01L 29/7391; H01L 29/2003; H01L 29/1608
  USPC .......................................... 257/139, 77, 288
  See application file for complete search history.

(56) References Cited

U.S. PATENT DOCUMENTS

| | | | |
|---|---|---|---|
| 2007/0007537 A1* | 1/2007 | Ogura | H01L 29/7828 257/77 |
| 2007/0007588 A1 | 1/2007 | Ishida et al. | |
| 2012/0181575 A1 | 7/2012 | Pfirsch | |
| 2012/0228700 A1 | 9/2012 | Nishii et al. | |
| 2013/0221401 A1 | 8/2013 | Ogura et al. | |
| 2013/0240947 A1 | 9/2013 | Matsudai et al. | |
| 2014/0061875 A1 | 3/2014 | Ogura et al. | |
| 2014/0124832 A1 | 5/2014 | Ogura et al. | |
| 2014/0231867 A1* | 8/2014 | Yamashita | H01L 29/872 257/140 |

\* cited by examiner

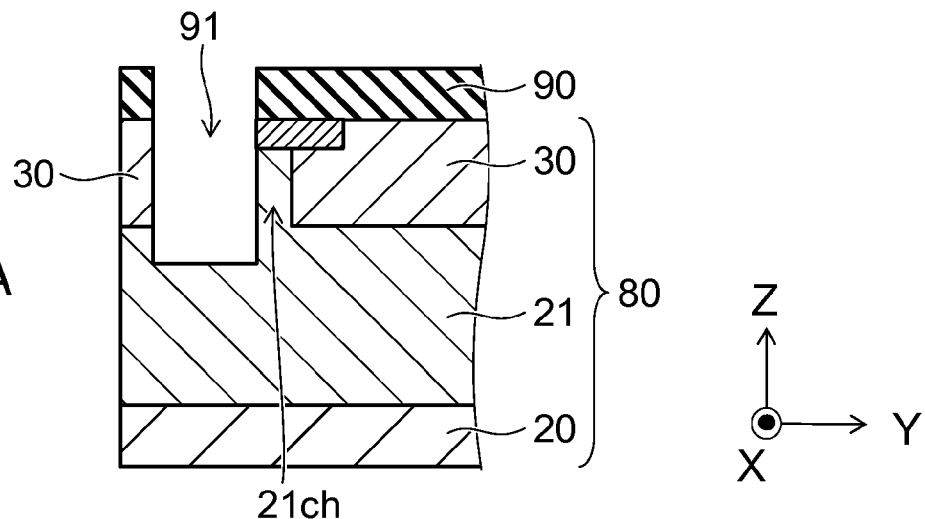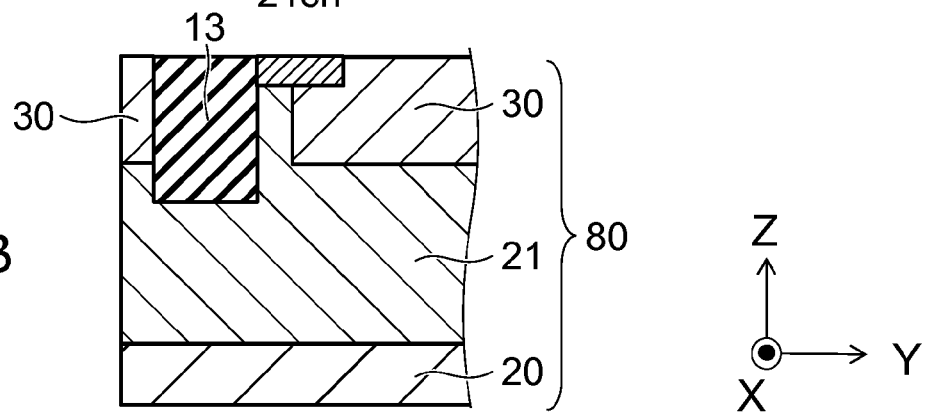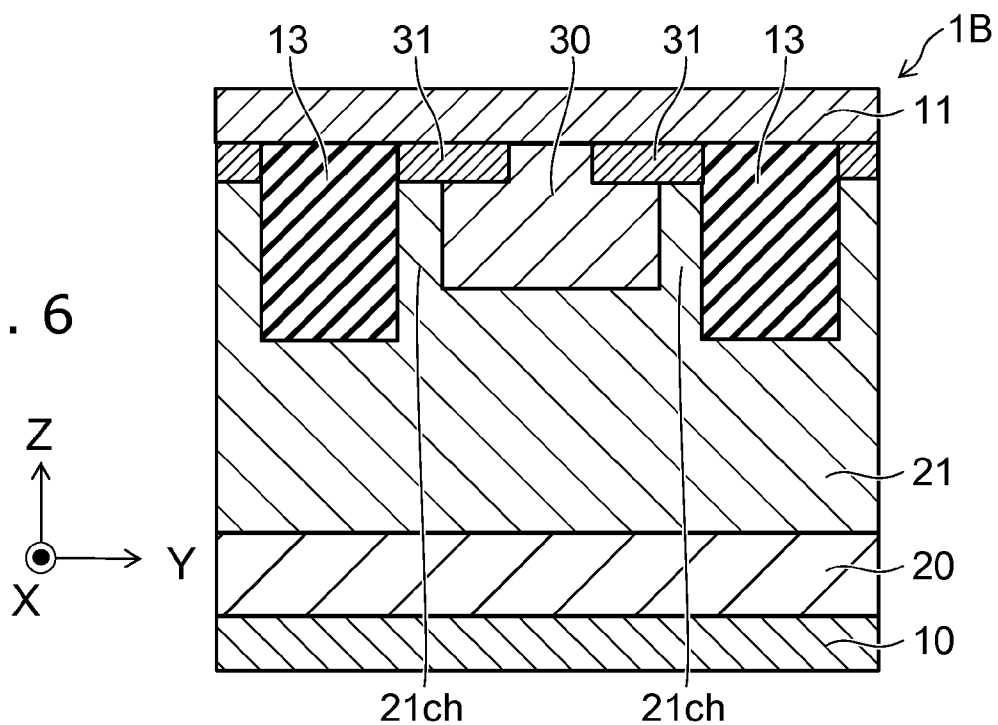

SEMICONDUCTOR DEVICE

CROSS-REFERENCE TO RELATED APPLICATIONS

This application is a continuation-in-part of application Ser. No. 14/485,028, filed on Sep. 12, 2014, which is based upon and claims the benefit of priority from Japanese Patent Application No. 2014-053320, filed on Mar. 17, 2014, and this application is further based on and claims benefit of Japanese Application No. 2015-052706, filed on Mar. 16, 2015 the entire contents of each are incorporated herein by reference.

FIELD

Embodiments described herein relate generally to a semiconductor device.

BACKGROUND

In recent years, insulated gate bipolar transistors (IGBTs), diodes, and the like are used as semiconductor devices used in power conversion devices such as inverters. The diodes are generally connected in an antiparallel manner to the IGBTs and are used as refluxing diodes. Because of this, the diodes are sometimes referred to as free wheeling diodes (FWDs).

Characteristic improvement of the FWDs is crucial on a par with characteristic improvement of the IGBTs in characteristic improvement of the power conversion devices such as the inverters. Crucial characteristics of the FWDs include an ON voltage (a voltage drop in a conduction state), a recovery time (an extinction time of a recovery current upon reverse recovery), a safe operation region upon recovery (a region not destroyed even if a voltage is applied in a state where the recovery current is flowing), and the like. Moreover, a smaller current and voltage oscillation upon recovery is more desirable. Among these, widening the safe operation region upon recovery while shortening the recovery time is crucial.

BRIEF DESCRIPTION OF THE DRAWINGS

FIG. 5A and FIG. 5B are schematic cross-sectional views illustrating a manufacturing process of the semiconductor device according to the first embodiment;

FIG. 6 is a schematic cross-sectional view illustrating a semiconductor device according to a first variation of the first embodiment;

DETAILED DESCRIPTION

Figure 1A:
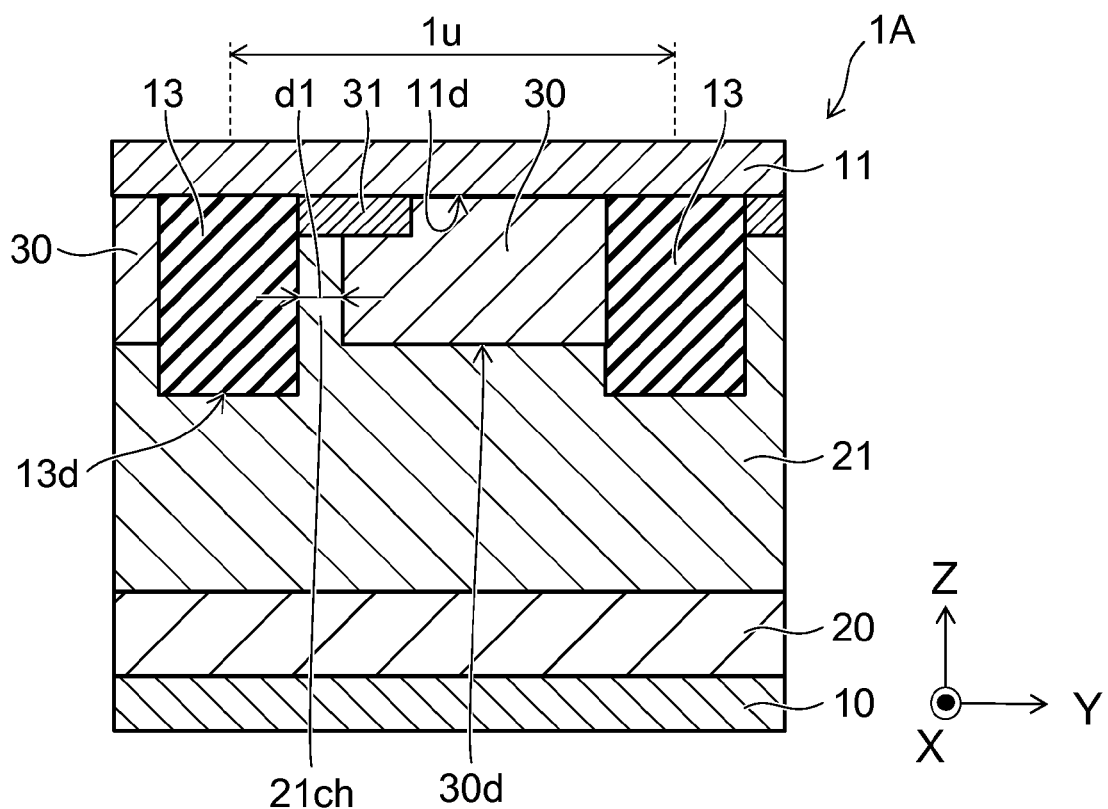
FIG. 1A is a schematic cross-sectional view illustrating a semiconductor device according to a first embodiment.

According to one embodiment, a semiconductor device includes a first electrode, a second electrode, a first semiconductor region of a first conductivity type, a second semiconductor region of a second conductivity type, an insulating region, and a third semiconductor region of the first conductivity type. The first semiconductor region is provided between the first electrode and the second electrode, and is in contact with the first electrode. The second semiconductor region is provided between the first semiconductor region and the second electrode. The second semiconductor region is in contact with the second electrode. The insulating region extends in a direction from the second electrode toward the first semiconductor region. The insulating region is in contact with the second electrode. The third semiconductor region is provided between the second semiconductor region and the insulating region.

Various embodiments will be described hereinafter with reference to the accompanying drawings. In the following description, the same reference numeral is applied to the same member, and for members that have been described once, the description is omitted as appropriate.

First Embodiment

Figure 1B:
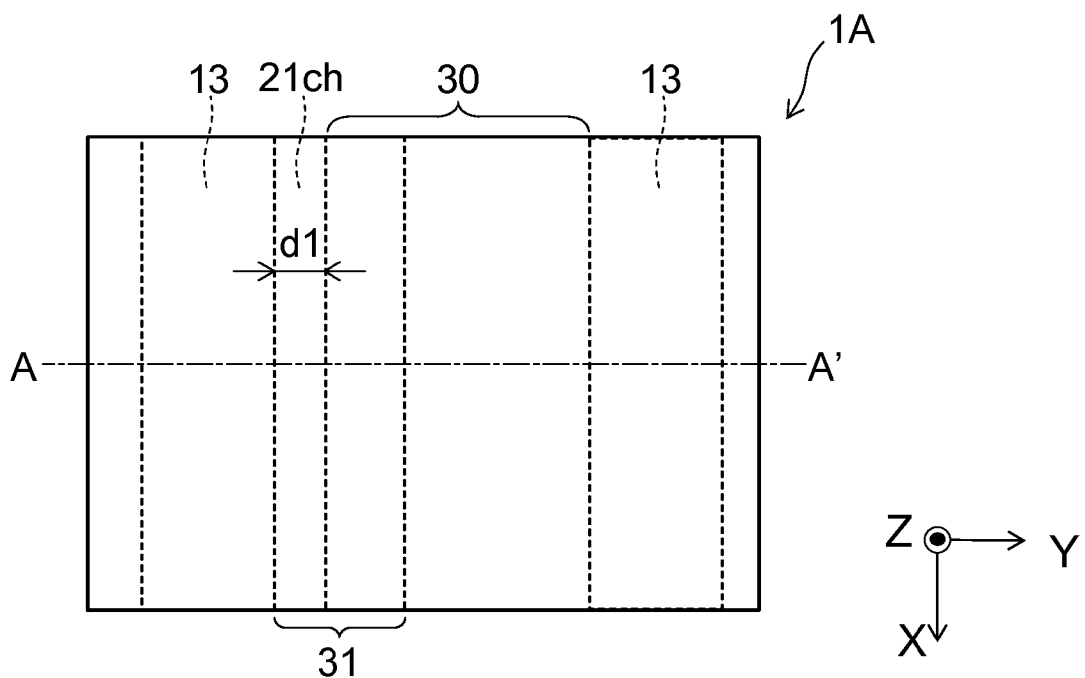
FIG. 1B is a schematic plan view illustrating the semiconductor device according to the first embodiment.

FIG. 1A is a schematic cross-sectional view illustrating a semiconductor device according to a first embodiment, and FIG. 1B is a schematic plan view illustrating the semiconductor device according to the first embodiment.

The A-A' cross section of FIG. 1B is illustrated in FIG. 1A. The range 1u illustrated in FIG. 1A is a range of a smallest unit of a semiconductor device 1A. The semiconductor device 1A uses the smallest unit to exhibit an action effect that will be described below.

The semiconductor device 1A is a type of a pin (p-intrinsic-n) diode. The semiconductor device 1A is used, for example, as a free wheeling diode such as an inverter circuit.

The semiconductor device 1A is provided with a cathode electrode 10 (first electrode) and an anode electrode 11 (second electrode). An $n^+$-type semiconductor region 20 is provided between the cathode electrode 10 and the anode electrode 11. The semiconductor region 20 is in contact with the cathode electrode 10. The semiconductor region 20 is in ohmic contact with the cathode electrode 10.

An n-type semiconductor region 21 is provided between the semiconductor region 20 and the anode electrode 11. The semiconductor region 20 and the semiconductor region 21 are combined to define a first semiconductor region. An impurity concentration of the semiconductor region 21 is less than an impurity concentration of the semiconductor region 20.

A concentration of impurity elements included in the semiconductor region 21 may be set to be less than a concentration of impurity elements included in the semiconductor region 20 on a face where the semiconductor region 20 is in contact with the cathode electrode 10. Moreover, an n-type buffer layer (not illustrated) may be provided between the semiconductor region 21 and the semiconductor region 20. An impurity concentration of the buffer layer is set, for example, to be between the impurity concentration included in the semiconductor region 21 and the impurity concentration included in the semiconductor region 20.

A p-type semiconductor region 30 (second semiconductor region) is provided between the semiconductor region 21 and the anode electrode 11. The semiconductor region 30 is in Schottky contact or in ohmic contact with the anode electrode 11. A thickness in the Z-direction of the semiconductor region 30 is, for example, from 0.5 μm (micrometers) to 10 μm.

An insulating region 13 is provided so as to be separated from the semiconductor region 30 with a gap d1 in at least a portion of a region in a Y-direction (third direction). That is, the insulating region 13 and the semiconductor region 30 are separated in at least a portion of a region in the Y-direction. The insulating region 13 is in contact with a lower portion 11d of the anode electrode 11, and extends from a side of the anode electrode 11 to a side of the semiconductor region 21. A channel region 21ch (third semiconductor region) to be described is sandwiched between the insulating region 13 and the semiconductor region 30. A distance between the insulating region 13 and the cathode electrode 10 may be shorter than a distance between the semiconductor region 30 and the cathode electrode 10. A lower portion 13d of the insulating region 13 is in contact with the semiconductor region 21. That is, a lower portion 13d of the insulating region 13 may be at a position lower than a lower portion 30d of the semiconductor region 30. Moreover, a plurality of insulating regions 13 is provided, and an insulating region 13 adjacent to the insulating region 13 described above is in contact with at least portion of the semiconductor region 30 from the anode electrode 11 and reaches the semiconductor region 21.

A $p^+$-type semiconductor region 31 (fourth semiconductor region) is provided between the anode electrode 11 and the channel region 21ch and between the anode electrode 11 and the semiconductor region 30. The semiconductor region 31 is in contact with the anode electrode 11 and the insulating region 13. An impurity concentration (or a maximum value or an average value of an impurity concentration profile in a Z-direction) of the semiconductor region 31 is greater than an impurity concentration (or the maximum value or the average value of the impurity concentration profile in the Z-direction) of the semiconductor region 30.

The semiconductor region 31 is in ohmic contact with the anode electrode 11. For example, a concentration of impurity elements included in the semiconductor region 31 on a face where the semiconductor region 31 is in contact with the anode electrode 11 is greater than a concentration of impurity elements included in the semiconductor region 30 on a face where the semiconductor region 30 is in contact with the anode electrode 11. A thickness of the semiconductor region 31 in the Z-direction is, for example, from 0.1 μm to 5 μm.

As illustrated in FIG. 1B, the insulating region 13, the semiconductor region 30, and the semiconductor region 31 each extend in an X-direction (second direction) that crosses the Z-direction (first direction) heading toward the cathode electrode 10 from the anode electrode 11.

A main component of each of the semiconductor regions 20, 21, 30, and 31, and the channel region 21ch is, for example, silicon (Si). Phosphorus (P), arsenic (As), or the like, for example, is applied as an impurity element of a conductivity type (first conductivity type) such as an $n^+$-type or an n-type. Boron (B) or the like is applied, for example, as an impurity element of a conductivity type (second conductivity type) such as a $p^+$-type or a p-type. Moreover, in addition to silicon (Si), the main component of each of the semiconductor regions 20, 21, 30, and 31 may be silicon carbide (SiC), gallium nitride (GaN), or the like.

Moreover, a maximum value of the impurity concentration of the semiconductor region 20 is greater than $3\times10^{17}$ $cm^{-3}$ and is, for example, $1\times10^{18}$ $cm^{-3}$ or greater. The impurity concentration of the semiconductor region 21 and the channel region 21ch may be set to increase toward the cathode electrode 10. The impurity concentration of the semiconductor region 21 and the channel region 21ch is, for example, $1\times10^{15}$ $cm^{-3}$ or less and can be set to any impurity concentration by a breakdown voltage design of a device. The maximum value of the impurity concentration of the semiconductor region 30 is, for example, $1\times10^{18}$ $cm^{-3}$ or less. The maximum value of the impurity concentration of the semiconductor region 31 is greater than $3\times10^{17}$ $cm^{-3}$ and is, for example, $1\times10^{19}$ $cm^{-3}$ or greater. These impurity concentrations of the p-type semiconductor regions may be set to increase toward the anode electrode 11.

Furthermore, the "impurity concentration" described above refers to an effective concentration of impurity elements contributing to conductivity of a semiconductor material. For example, if the semiconductor material contains impurity elements that act as donors and impurity elements that act as acceptors, a concentration where an offset amount of the donors and acceptors is removed from among the activated impurity elements is defined as the impurity concentration. Here, a level of the impurity concentration in the embodiment is compared by a maximum value or an average value of an impurity concentration profile in the Z-direction.

Furthermore, in the embodiment, unless otherwise specified, the concentration of the n-type impurity elements is represented as decreasing in order of the $n^+$-type and then the n-type. Moreover, the concentration of the p-type impurity elements is represented as decreasing in order of the $p^+$-type and then the p-type. Moreover, in the semiconductor device 1A, a similar effect can be obtained even if the conductivity types of p and n are interchanged.

Furthermore, in the embodiment, unless otherwise specified, the impurity concentration of the $n^+$-type semiconductor region being greater than the impurity concentration of the n-type semiconductor region also includes a situation where the impurity concentration of the $n^+$-type semiconductor region on a face of the $n^+$-type semiconductor region that is in contact with the cathode electrode 10 is greater than the impurity concentration of the n-type semiconductor region. Moreover, in the embodiment, the impurity concentration of the $p^+$-type semiconductor region being greater than the impurity concentration of the p-type semiconductor region also includes a situation where the impurity concentration of the $p^+$-type semiconductor region on a face of the $p^+$-type semiconductor region that is in contact with the anode electrode 11 is greater than the impurity concentration of the p-type semiconductor region on a face of the p-type semiconductor region that is in contact with the anode electrode 11.

A material of the cathode electrode 10 and a material of the anode electrode 11 are, for example, a metal that includes at least one selected from the group consisting of aluminum (Al), titanium (Ti), nickel (Ni), tungsten (W), gold (Au), and the like. Moreover, the material of the anode electrode of the Schottky portion may be different from the material of the anode electrode of the ohmic portion.

An operation of the semiconductor device 1A will be described.

Figure 2A:
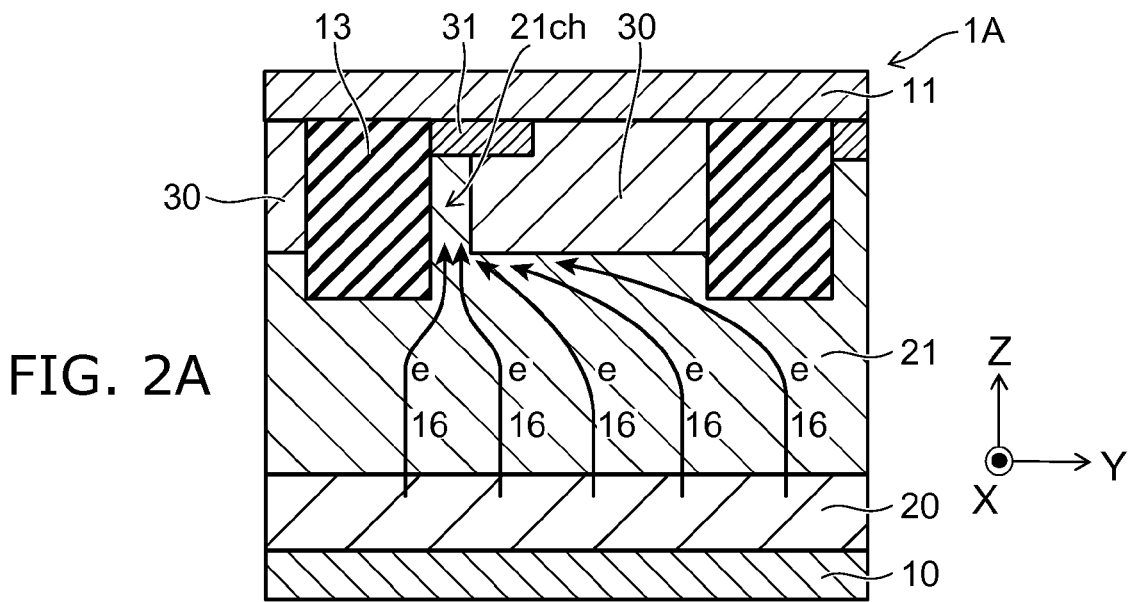
FIG. 2A and FIG. 2B are schematic cross-sectional views illustrating an operation in an ON state of the semiconductor device according to the first embodiment.
Figure 2B:
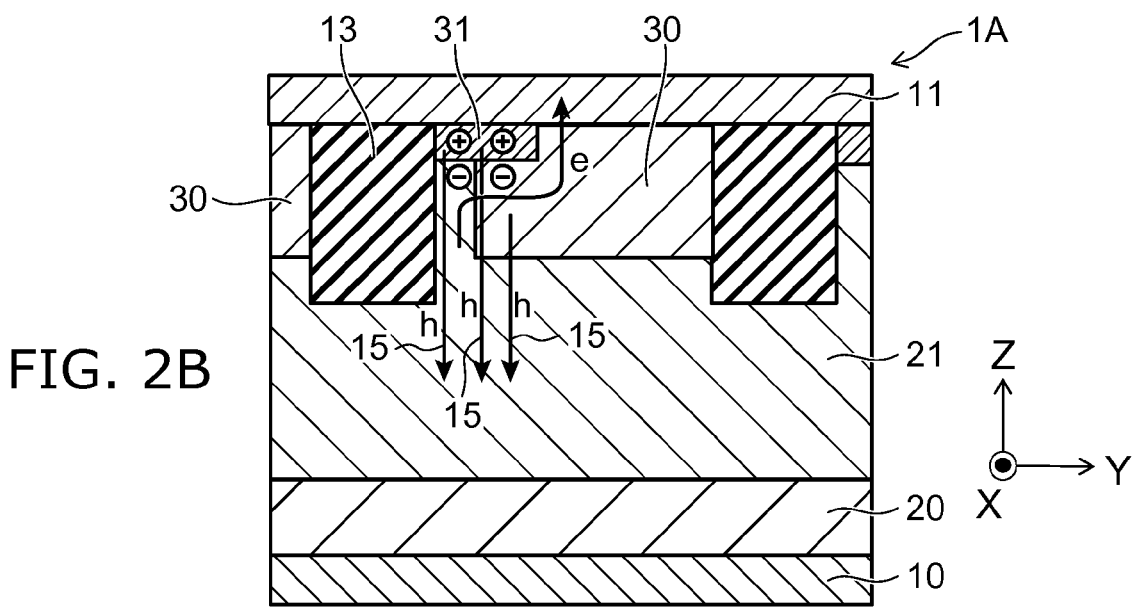
Figure 2C:
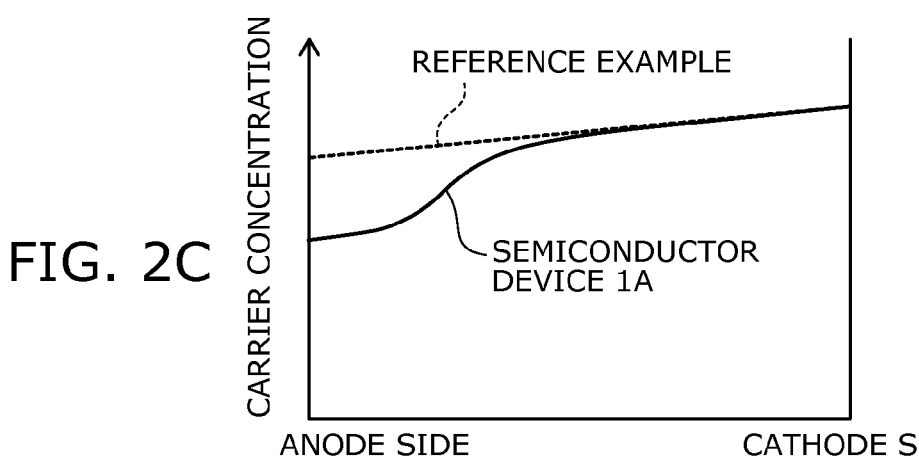
FIG. 2C is a diagram showing a carrier concentration distribution in the ON state of the semiconductor device according to the first embodiment and according to a reference example.

FIG. 2A and FIG. 2B are schematic cross-sectional views illustrating an operation in an ON state of the semiconductor device according to the first embodiment, and FIG. 2C is a diagram showing a carrier concentration distribution in the ON state of the semiconductor device according to the first embodiment and according to a reference example.

First, an electron current that flows from a cathode side to an anode side will be described using FIG. 2A.

In the ON state, a forward bias voltage is applied between a cathode and an anode. That is, a voltage is applied between the cathode and the anode so that a potential of the anode electrode 11 is greater than a potential of the cathode electrode 10. For example, the anode electrode 11 is a positive electrode and the cathode electrode 10 is a negative electrode.

Here, the semiconductor region 20 is in ohmic contact with the cathode electrode 10. Therefore, electrons (e) arrive directly below the semiconductor region 30 from the semiconductor region 20 via the semiconductor region 21.

The semiconductor device 1A has the channel region 21ch provided in at least a portion of a region between the semiconductor region 30 and the insulating region 13. In the embodiment, the region sandwiched between the semiconductor region 30 and the insulating region 13 is referred to as a channel region 21ch. The channel region 21ch is in contact with the semiconductor region 21. In case that the channel region 21ch is referred to as a portion of the semiconductor region 21, the channel region 21ch and the semiconductor region 21 may be collectively defined as the semiconductor region 21.

The channel region 21ch is the n-type. Therefore, as illustrated in FIG. 2A, the electrons flow to the anode electrode 11 via the channel region 21ch, which has a low potential, rather than crossing over an energy barrier between the semiconductor region 21 and the semiconductor region 30.

Note that the semiconductor region 30 is in resistive contact or in Schottky contact with the anode electrode 11. That is, this contact is resistive contact or Schottky contact between a p-type semiconductor and a metal. As a result, in case of the Schottky contact, while the junction between the semiconductor region 30 and the anode electrode 11 is an energy barrier for holes (h), this region is not an energy barrier for the electrons (e). By this, the electrons are discharged to the anode electrode 11 via the semiconductor region 30.

In this manner, the electrons (e) flow into the anode electrode 11 via the semiconductor region 20, the semiconductor region 21, the channel region 21ch, and the semiconductor region 30. By this, an electron current 16 is formed between the cathode and the anode.

Next, a hole current flowing from the anode side to the cathode side during forward bias application is illustrated in FIG. 2B.

A junction between the semiconductor region 31, which is a p-type high-concentration layer, and the n-type semiconductor region 21 is an energy barrier for the electrons (e). Therefore, the electrons that arrive directly below the semiconductor region 31 are less likely to flow into the semiconductor region 31. As described above, the junction between the semiconductor region 30 and the anode electrode 11 is not an energy barrier for the electrons (e), so that the electrons (e) move in a horizontal direction below the semiconductor region 31, that is, a direction approximately parallel to the Y-direction, and the electrons (e) flow into the anode electrode 11.

By this horizontal direction movement of the electrons (e), a voltage drop occurs below the semiconductor region 31. By this, the semiconductor region 31 in contact with the anode electrode 11 becomes a positive electrode, and the channel region 21ch and the semiconductor region 30 positioned below the semiconductor region 31 are biased so as to become a negative electrode relative to the semiconductor region 31.

By this bias, an energy barrier against the holes between the channel region 21ch and the semiconductor region 31 and between the semiconductor region 30 and the semiconductor region 31 decreases below the semiconductor region 31. By this, the holes (h) are injected in the channel region 21ch and the semiconductor region 30 from the semiconductor region 31. A hole current 15 is formed by these injected holes (h).

The hole current 15 increases as a width of the semiconductor region 31 in the Y-direction or in the X-direction, or a contact surface area between the semiconductor region 31 and the anode electrode 11, increases. In other words, an injection amount of the holes from the anode side is adjusted by this width or this contact surface area.

In the semiconductor device 1A, the electrons flow to the anode electrode 11 via the channel region 21ch. That is, the electrons are less likely to flow to the anode electrode 11 from the semiconductor region 21 directly below the semiconductor region 30 via the semiconductor region 30.

If the electrons are injected in the semiconductor region 30 from the semiconductor region 21, hole injection induced by this electron injection occurs from the semiconductor region 30 to the semiconductor region 21. In the semiconductor device 1A, this hole injection is reliably suppressed by flowing the electrons to the anode electrode 11 via the channel region 21ch.

Carrier concentration distribution in an ON state of the semiconductor region 21 is shown in FIG. 2C. The reference example is, for example, a device where the channel region 21ch is removed from the semiconductor device 1. A carrier concentration on the anode side in the first embodiment is lower than that of the reference example. That is, FIG. 2C shows how, in the first embodiment, hole injection from the semiconductor region 30 decreases because the electrons injected from the cathode side flow to the anode electrode 11 via the n-type channel region 21ch.

In this manner, in the ON state, the holes flow from the anode side to the cathode side and the electrons flow from the cathode side to the anode side. On the anode side, in contrast to the holes being injected from the semiconductor region 31, the injection amount of the holes from the semiconductor region 30 is small, and the semiconductor region 30 mainly contributes in discharging the electrons. By this, in the semiconductor device 1A, a recovery speed thereof speeds up.

Next, a recovery operation of the semiconductor device 1A will be described.

Figure 3A:
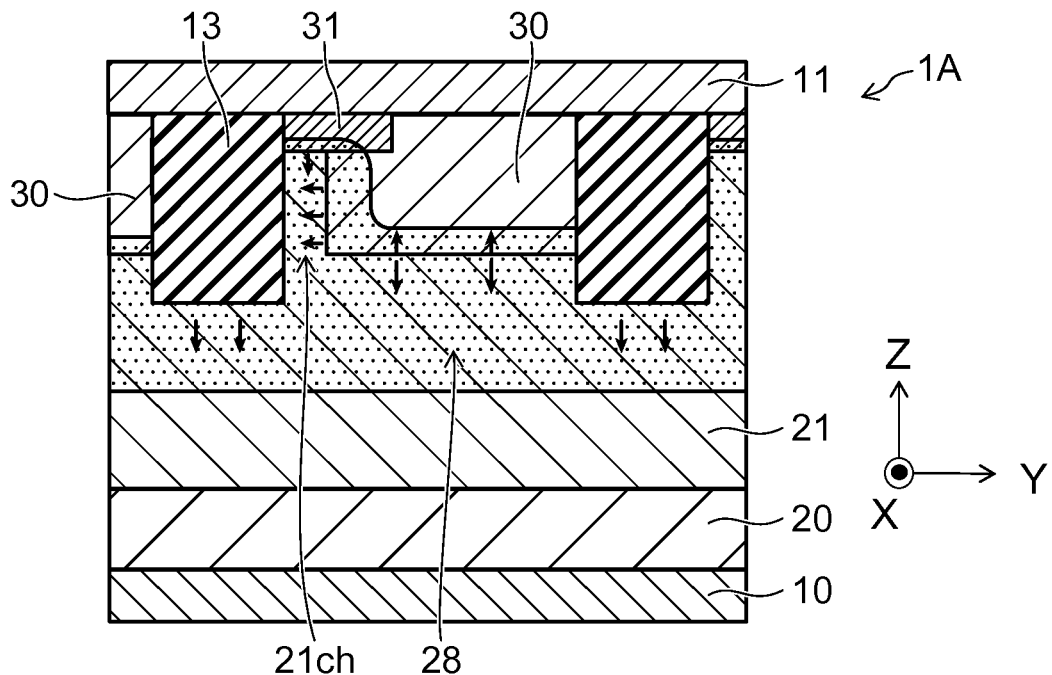
FIG. 3A and FIG. 3B are schematic cross-sectional views illustrating an operation in a recovery state of the semiconductor device according to the first embodiment.
Figure 3B:
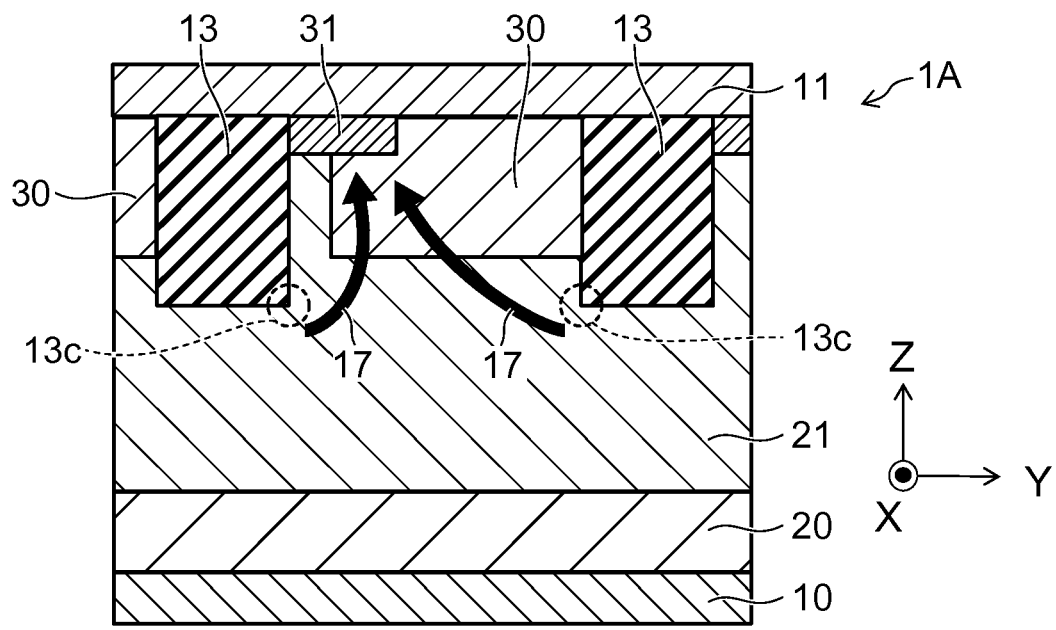

FIG. 3A and FIG. 3B are schematic cross-sectional views illustrating an operation in a recovery state of the semiconductor device according to the first embodiment.

Illustrated in FIG. 3A is a state upon recovery where a reverse bias is applied after a state where a forward bias is applied between the anode and the cathode. Here, a voltage is applied between the cathode and the anode so that the anode electrode 11 is a negative electrode and the cathode electrode 10 is a positive electrode.

When the reverse bias is applied between the anode and the cathode after the state where the forward bias is applied between the anode and the cathode, the holes (h) present in the semiconductor region 21 move to a side of the anode electrode 11. Moreover, the electrons (e) present in the semiconductor region 21 move to a side of the cathode electrode 10.

Here, the electrons (e) flow into the cathode electrode 10 via the semiconductor region 20. Meanwhile, the holes (h) flow into the anode electrode 11 via the semiconductor region 31.

Upon recovery, in a state where the electrons are flowing to the cathode electrode 10 and the holes are flowing to the anode electrode 11, a depletion layer 28 spreads in the channel region 21ch, the semiconductor region 21, the semiconductor region 30, and the semiconductor region 31 from a junction of the semiconductor region 30 and the channel region 21ch, a junction of the semiconductor region 31 and the channel region 21ch, a junction of the insulating region 13 and the channel region 21ch and a junction of the semiconductor region 30 and the semiconductor region 21, as starting points. By this, conduction between the anode electrode 11 and the cathode electrode 10 in the semiconductor device 1A is gradually cut off.

Here, in the channel region 21ch, whose width in the Y-direction is narrow, the depletion layer 28 spreads from the junction of the semiconductor region 30 and the channel region 21ch, the junction of the semiconductor region 31 and the channel region 21ch, and the junction of the insulating region 13 and the channel region 21ch as the starting points.

Because of this, the channel region 21ch is completely depleted. Therefore, in the semiconductor device 1A, a backward current (leakage current) is reliably suppressed when the reverse bias is applied. Note that to completely deplete the channel region 21ch, it is noted that the width d1 of the channel region 21ch is sufficiently narrow, for example, 1 μm or less as an example of a narrowest width.

However, in a pin diode, there is generally a situation where electric field concentration occurs at any location of a PN junction in a semiconductor chip upon recovery to induce an avalanche. In the first embodiment, because the holes (h) flow into the anode electrode 11 via the semiconductor region 31, an adverse effect, such as destruction, induced by this avalanche is suppressed and a safe operation region upon recovery is enlarged.

Illustrated in FIG. 3B is an operation in the recovery state of the semiconductor device 1A.

For example, the insulating region 13 has a corner portion 13c positioned inside the semiconductor region 21. An electric field is easily focused on this corner portion 13c upon recovery. By this, the avalanche easily occurs near the corner portion 13c. A flow of holes (h) generated by the avalanche is defined as an avalanche current 17. Then, the avalanche current 17 is discharged to the anode electrode 11 via the semiconductor region 31. Here, if the gap 1u becomes wide, the electric field at the corner portion 13c becomes strong and the avalanche current becomes large. Because of this, it is noted that the gap 1u between the insulating regions 13 is sufficiently narrow, the gap 1u is electron diffusion length or less preferably. It is favorable for the gap 1u to be, preferably, 10 μm or less.

Furthermore, a plurality of corner portions 13c (insulating regions 13) is provided in the semiconductor device 1A. In the semiconductor device 1A, because the avalanche occurs easily at each of the plurality of corner portions 13c, a location where the avalanche occurs is dispersed. Therefore, the avalanche current is also dispersed near each of the plurality of corner portions 13c. Then, the avalanche current is discharged to the anode electrode 11 via each of the plurality of semiconductor regions 31. By this, a breakdown tolerance of the semiconductor device 1A upon recovery is improved.

Note that this structure has the semiconductor region 31 that is the p-type high-concentration layer. In this structure, an n-type high-concentration layer like n-channel type MOSFET is not provided at a position similar to the position of the semiconductor region 31. Moreover, if the n-type high-concentration layer exists and the PN junction is not present, the electric field cannot be applied to the n-type high-concentration layer and the n-type channel region 21ch in an OFF state. In the embodiment, it is a significant feature that an electric field can be applied in the OFF state and a breakdown voltage can be had even in a switching state or a static OFF state due to the existence of the semiconductor region 31 of the p-type high-concentration layer. These features are disclosed for the first time in the embodiment.

As described above, with the semiconductor device 1A according to the first embodiment, both speeding up the recovery speed and the improvement of the breakdown tolerance upon recovery, that is, enlarging the safe operation area (SOA), can be achieved.

FIG. 4A to FIG. 5B are schematic cross-sectional views illustrating an example of a manufacturing process of the semiconductor device according to the first embodiment.

Figure 4A:
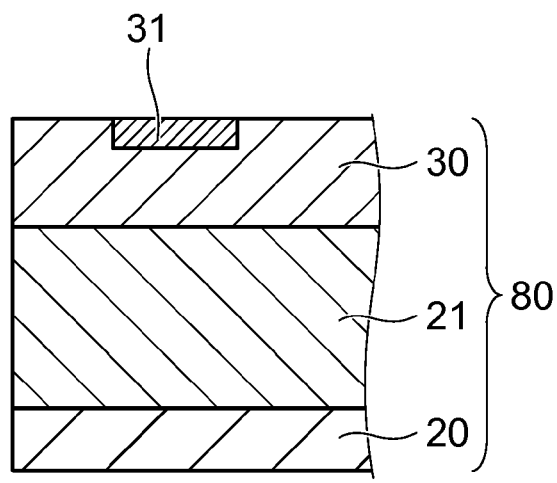
FIG. 4A to FIG. 4C are schematic cross-sectional views illustrating an example of a manufacturing process of the semiconductor device according to the first embodiment.

First, as illustrated in FIG. 4A, a stacked body 80 having the semiconductor region 20, the semiconductor region 21, and the semiconductor region 30 is prepared. Here, the semiconductor region 31 is selectively formed on the semiconductor region 30.

Figure 4B:
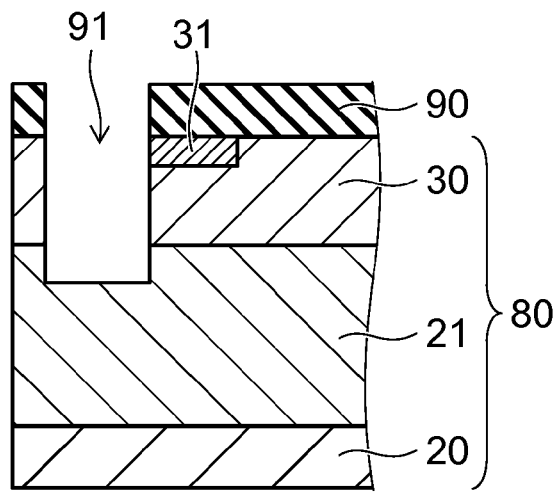

Next, as illustrated in FIG. 4B, a mask pattern 90 is formed on the stacked body 80, and an etching process is applied on the stacked body 80 opened through the mask pattern 90. By this, a trench 91 that reaches from a surface of the stacked body 80 to the semiconductor region 21 is formed.

Figure 4C:
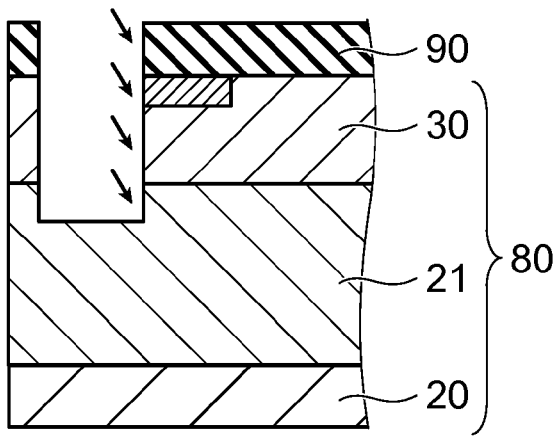

Next, as illustrated in FIG. 4C, n-type impurity elements (for example, phosphorus, arsenic, or the like) are implanted in the semiconductor region 30 exposed in the trench 91. Here, an oblique ion implantation method that implants the n-type impurity elements in a direction of the arrow in FIG. 4B is used.

Next, an annealing treatment is applied on the stacked body 80. By this, as illustrated in FIG. 5A, the channel region 21ch is formed along a first inner wall of the trench 91. After this, the mask pattern 90 is removed.

Next, as illustrated in FIG. 5B, the insulating region 13 is formed in the trench 91. After this, as illustrated in FIG. 1A, the anode electrode 11 and the cathode electrode 10 are formed.

(First Variation of the First Embodiment)

FIG. 6 is a schematic cross-sectional view illustrating a semiconductor device according to a first variation of the first embodiment.

The channel region 21 is not limited to a structure of being provided on one side of the semiconductor region 30 in the Y-direction. For example, as in a semiconductor device 1B illustrated in FIG. 6, the channel region 21 may be provided on both sides of the semiconductor region 30. Such a structure enables achievement both further speeding up the recovery speed and improvement of the breakdown tolerance upon recovery, that is, enlarging the safe operation area (SOA). This is because injected carriers can be further reduced and speeding up can be achieved due to an effective area of the channel region 21ch increasing and because the avalanche current is easier to discharge due to an effective area of the semiconductor region 31 increasing.

Figure 11:
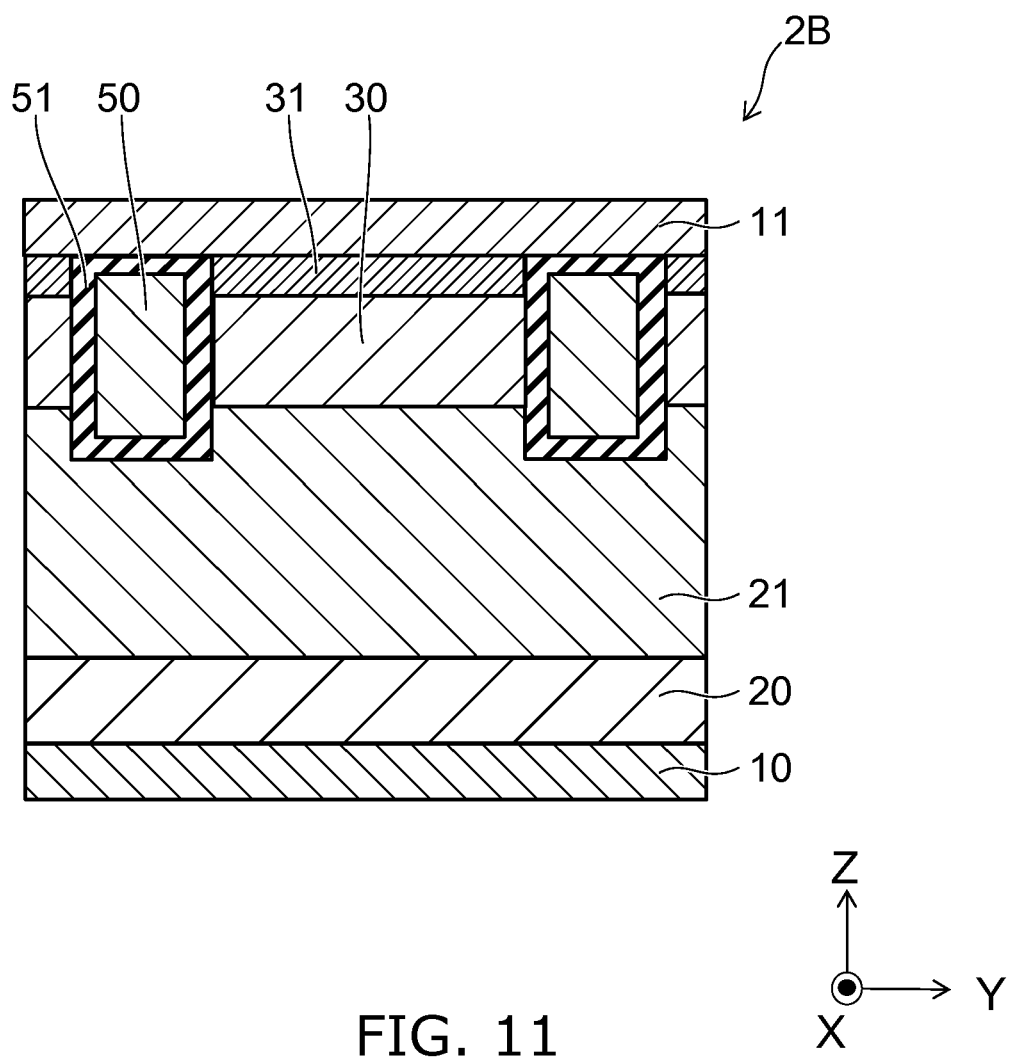
FIG. 11 is a schematic cross-sectional view illustrating a semiconductor device according to a variation of the second embodiment.

Furthermore, the semiconductor region 31 may continuously extend in the Y-direction and be in contact with the adjacent insulating region 13 as illustrated in FIG. 11 described later (not illustrated). In such a case, the semiconductor region 30 is in contact with directly the anode electrode 11 in the X-direction, and electrons flow into the anode electrode 11 via the channel region 21ch similar to the first embodiment. That is, electrons are less likely to flow into the anode electrode 31 via the channel region 21ch. That is, electrons are less likely to flow into the anode electrode 11 from the semiconductor region 21 directly below the semiconductor region 30 via the semiconductor region 30.

(Second Variation of the First Embodiment)

Figure 7A:
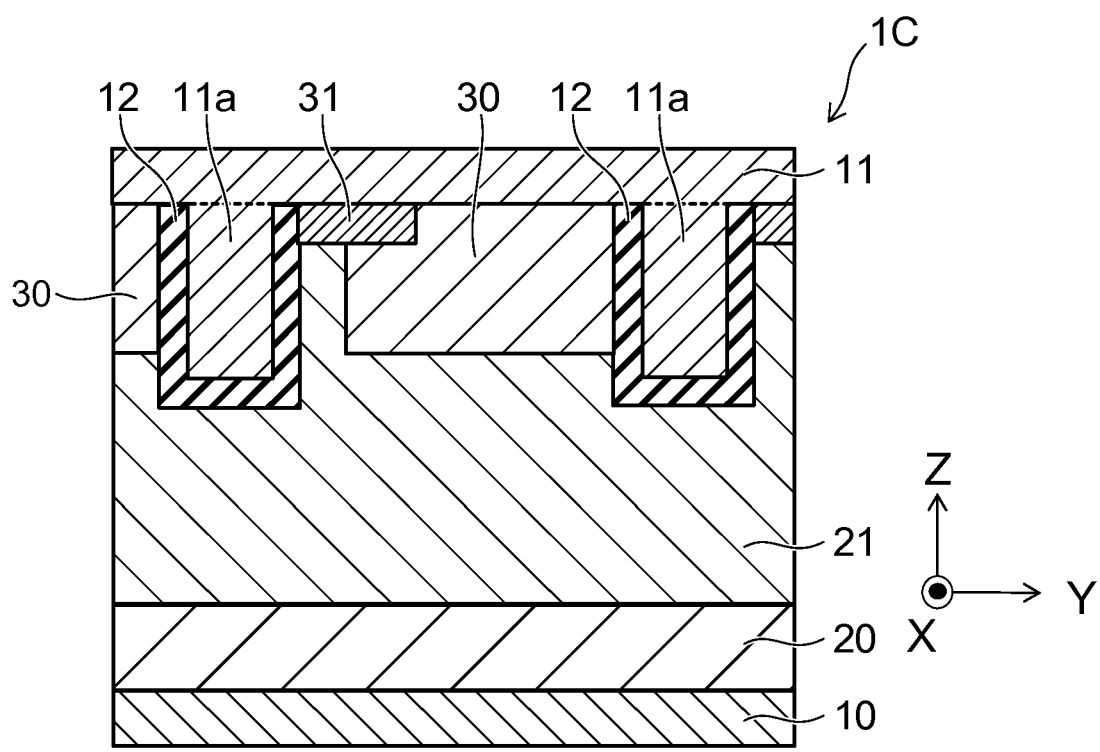
FIG. 7A is a schematic cross-sectional view illustrating a semiconductor device according to a second variation of the first embodiment.
Figure 7B:
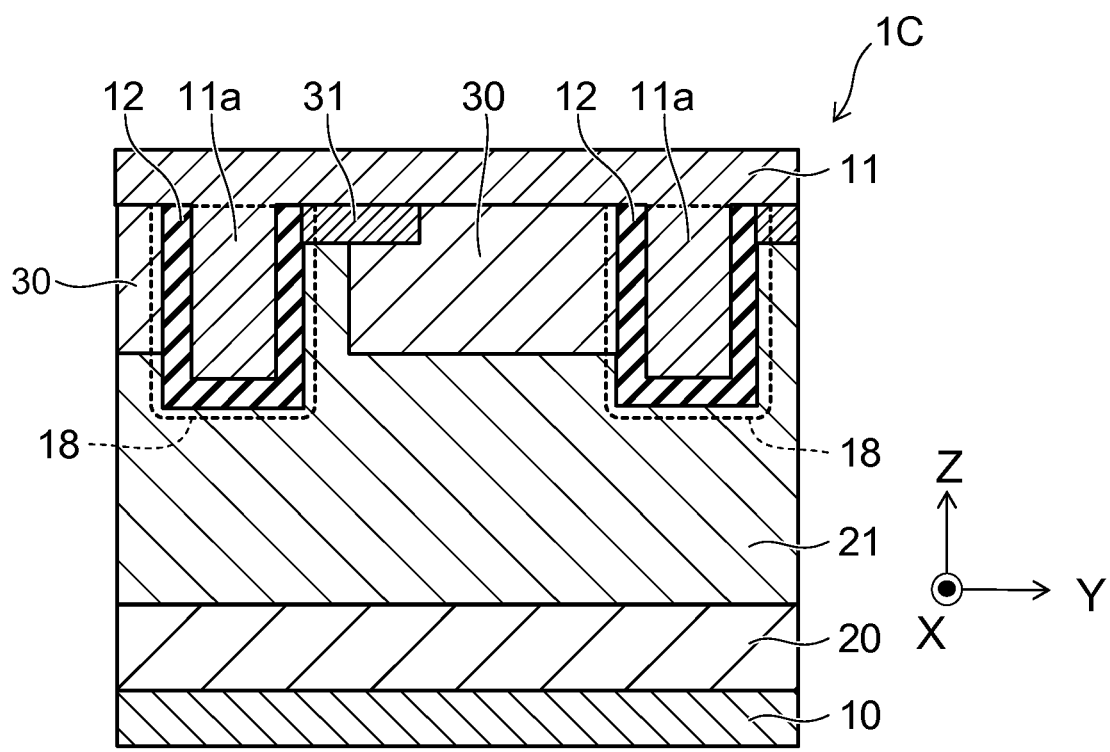
FIG. 7B is a schematic cross-sectional view illustrating an operation in a recovery state thereof.

FIG. 7A is a schematic cross-sectional view illustrating a semiconductor device according to a second variation of the first embodiment, and FIG. 7B is a schematic cross-sectional view illustrating an operation in a recovery state thereof.

In a semiconductor device 1C illustrated in FIG. 7A, a portion of the insulating region 13 described above is configured as a connection region 11a and an insulating region 12. The connection region 11a is in contact with the anode electrode 11a. The connection region 11a is provided between the anode electrode 11 and the insulating region 12. A material of the connection region 11a is polysilicon but is not limited to polysilicon and may be the same material as that of the anode electrode 11. A material of the insulating region 12 is, for example, silicon oxide.

The connection region 11a extends toward the cathode electrode 10 from the anode electrode 11. The connection region 11a and the insulating region 12 extend, for example, in the X-direction. The connection region 11a and the insulating region 12 are arranged, for example, in the Y-direction.

Furthermore, because an identical negative potential is applied to the connection region 11a upon recovery as the anode electrode 11, a layer 18 whose hole concentration is increased is induced along the insulating region 12 (FIG. 7B). This layer 18 is a layer with low resistance against the holes (h). That is, forming the layer 18 of low resistance further increases an efficiency of the holes (h) being discharged to the anode electrode 11. Moreover, by this, the breakdown tolerance upon recovery can be improved. Moreover, a characteristic is that a width of the channel region 21ch becomes narrow due to the layer 18 whose hole concentration is increased, a leak current during voltage application decreases, and a device characteristic is improved.

(Third Variation of the First Embodiment)

Figure 8A:
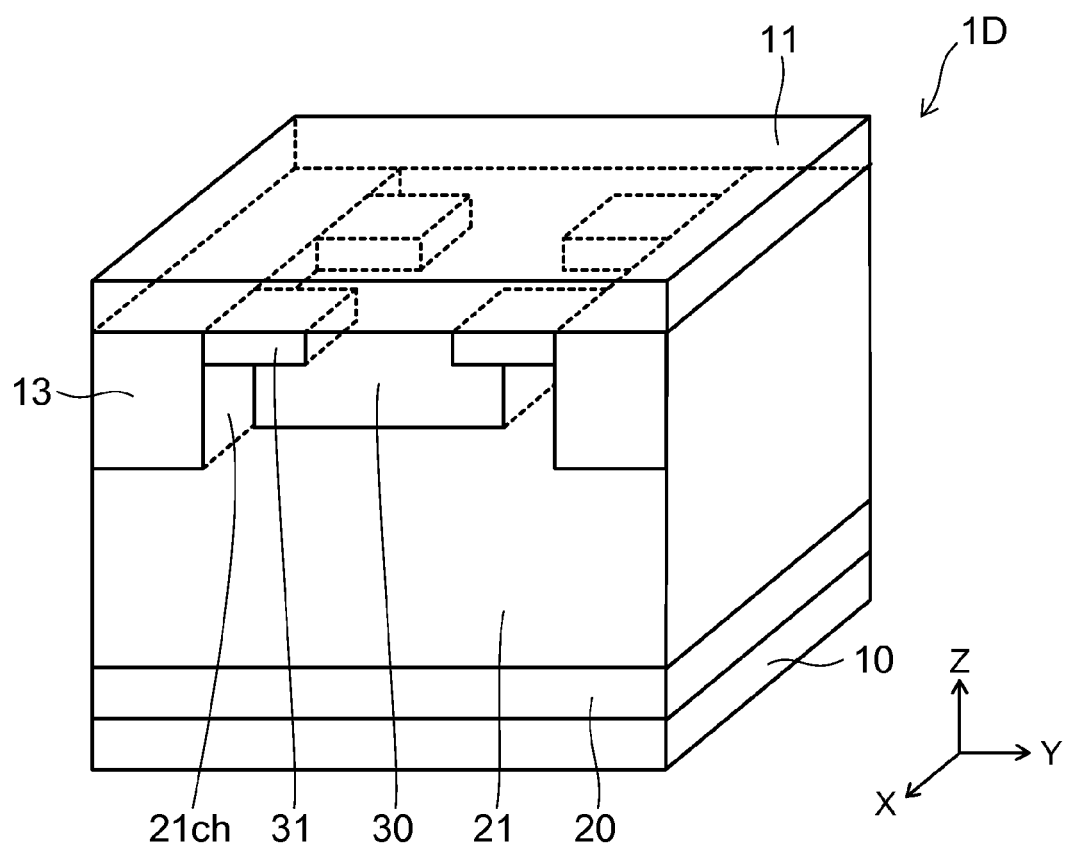
FIG. 8A is a schematic cross-sectional view illustrating a semiconductor device according to a third variation of the first embodiment.
Figure 8B:
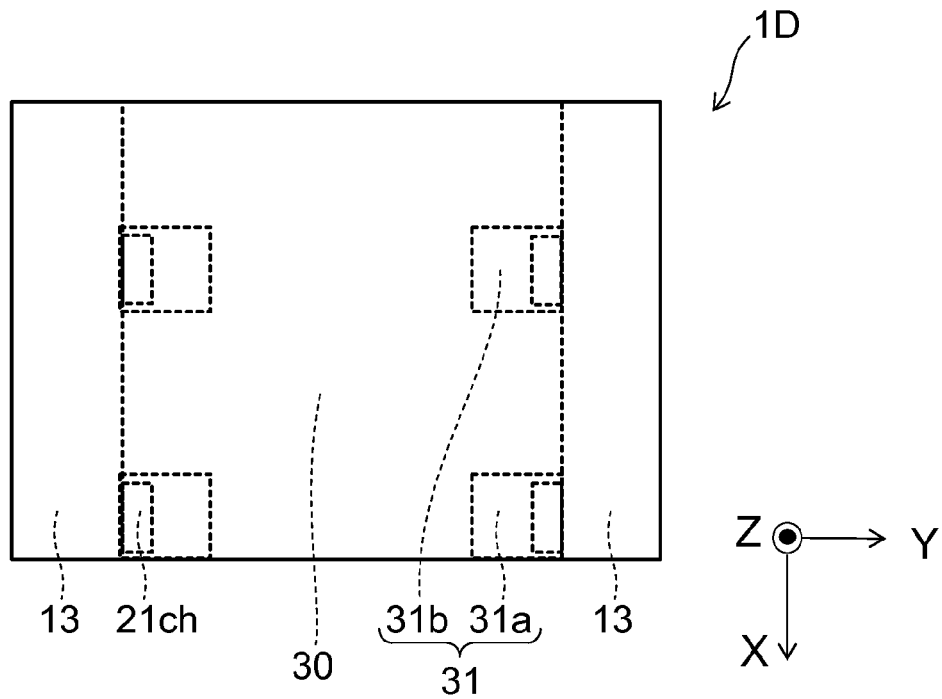
FIG. 8B is a schematic plan view illustrating the semiconductor device according to the third variation of the first embodiment.

FIG. 8A is a schematic cross-sectional view illustrating a semiconductor device according to a third variation of the first embodiment, and FIG. 8B is a schematic plan view illustrating the semiconductor device according to the third variation of the first embodiment.

In a semiconductor device 1D, the semiconductor region 31 is divided into a plurality of regions 31a. Each of the plurality of regions 31a is arranged in the X-direction. That is, the semiconductor region 31 is disposed by being thinned out in the X-direction.

In the semiconductor device 1D, there is, in the X-direction, a region where the semiconductor region 31 is provided and a region where the semiconductor region 31 is not provided. By this, the contact surface area between the semiconductor region 31 and the anode electrode 11 further decreases. As a result, in the semiconductor device 1D, the injection amount of the holes from the anode side is further suppressed, and the recovery speed thereof is sped up further.

Second Embodiment

Figure 9A:
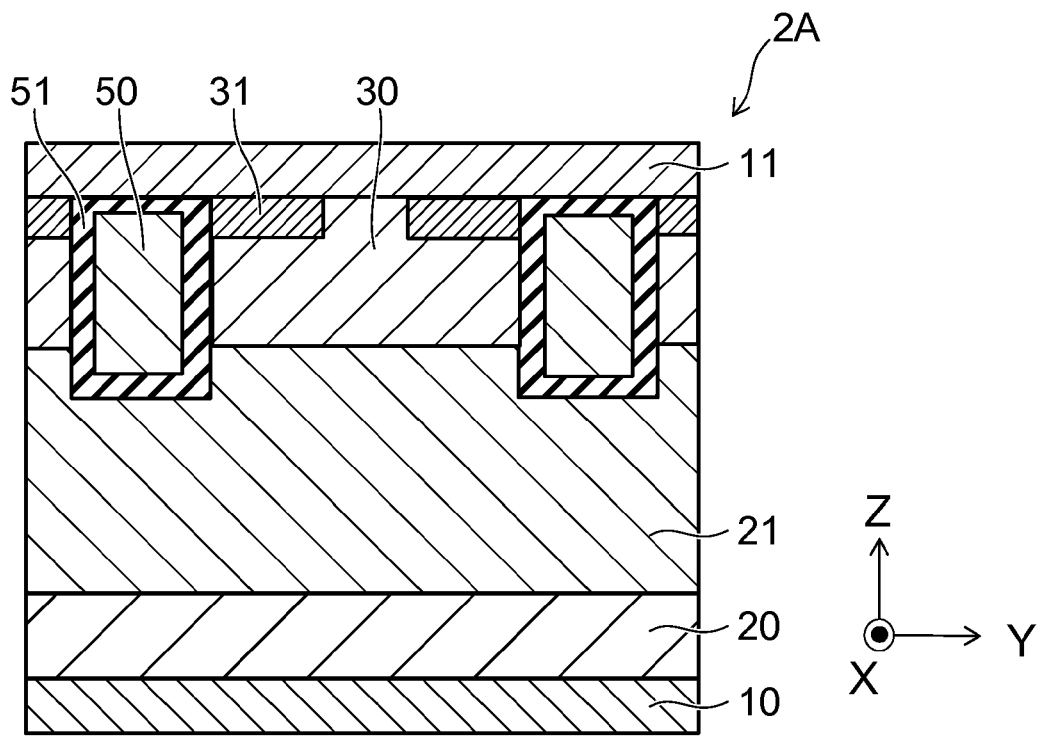
FIG. 9A and FIG. 9B are schematic cross-sectional views illustrating a semiconductor device according to a second embodiment.
Figure 9B:
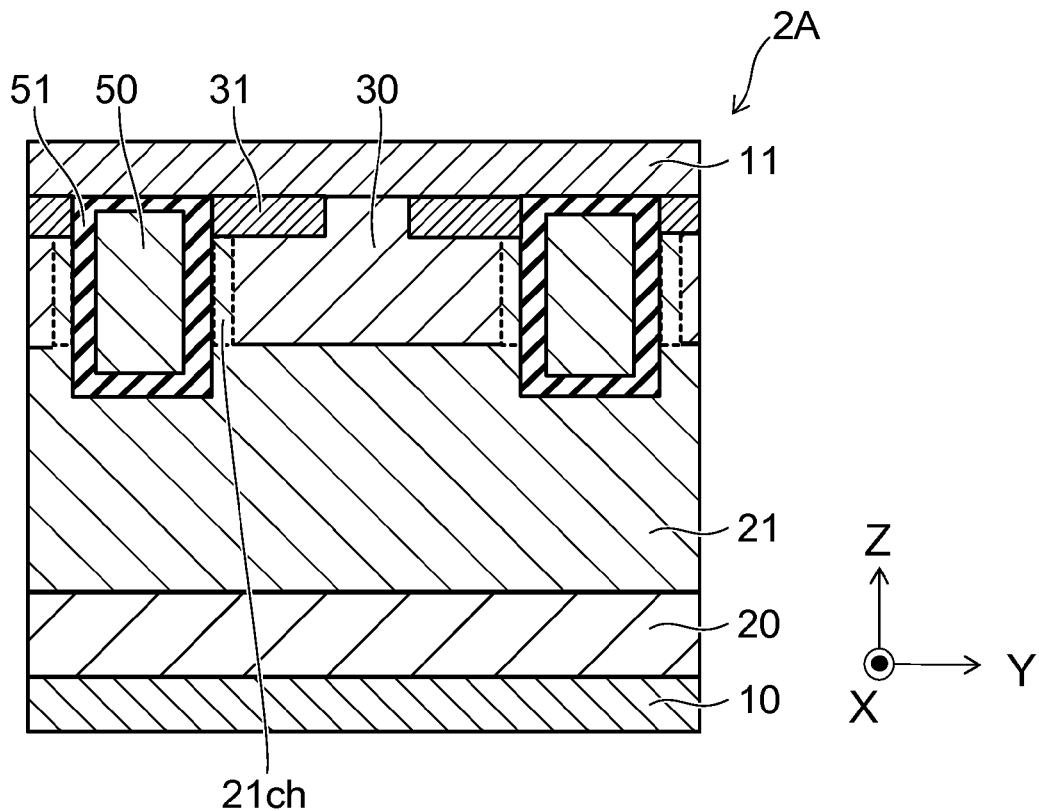

FIG. 9A and FIG. 9B are schematic cross-sectional views illustrating a semiconductor device according to a second embodiment.

A semiconductor device 2A illustrated in FIG. 9A is provided with the cathode electrode 10 and the anode electrode 11, similar to the semiconductor device 1A. Moreover, the semiconductor device 2A is provided with the semiconductor region 20, the semiconductor region 21, the semiconductor region 30, and the semiconductor region 31. The semiconductor region 31 is in contact with the anode electrode 11 and an insulating film 51.

However, in the semiconductor device 2A, a portion of the insulating region 13 described above is configured as an electrode 50 and the insulating film 51 (insulating region). The electrode 50 is in contact with the semiconductor region 21, the semiconductor region 30, and the semiconductor region 31 via the insulating film 51. The electrode 50 is electrically insulated from the anode electrode 11. The electrode 50 is provided in the insulating film 51. In the semiconductor device 2A, the channel region 21ch can be formed by applying a positive bias relative to the anode electrode 11 on the electrode 50. Because of this, one characteristic of the embodiment is being able to be easily manufactured.

For example, a state where a positive potential (for example, +15 V) is applied on the electrode 50 is illustrated in FIG. 9B. In this situation, an n-type inversion layer is formed along the insulating film 51 on the semiconductor region 30, and the channel region 21ch is formed substantially between the semiconductor region 30 and the insulating film 51. That is, the semiconductor device 2A is substantially of the same configuration as the semiconductor device 1A in the state where the positive potential is applied on the electrode 50.

Therefore, in the semiconductor device 2A as well, both speeding up the recovery speed and improvement of the breakdown tolerance upon recovery, that is, enlarging the safe operation region, can be achieved. Note that in the semiconductor region 2A, the semiconductor region 31 may be divided into the plurality of regions 31a, and each of the plurality of regions 31a may be arranged in the X-direction.

Note that a potential of the electrode 50 may be controlled, via, for example, an electrode terminal, by a gate driver of an IGBT included with the semiconductor device 2A in the semiconductor chip or may be controlled by a driver for an FWD.

Figure 10A:
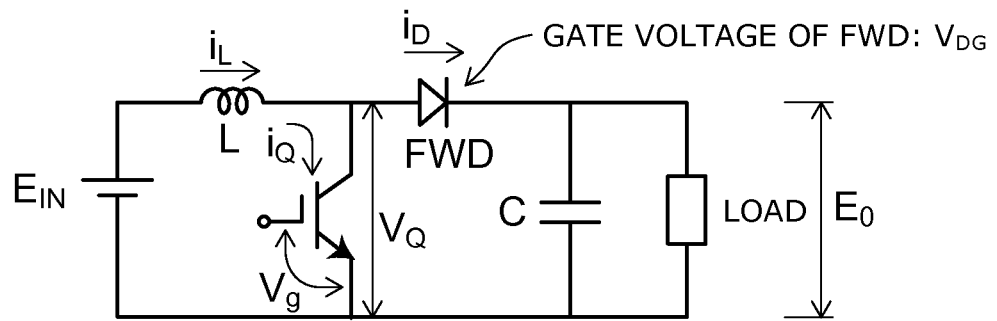
FIG. 10A is an example of a circuit diagram of the semiconductor device according to the second embodiment.
Figure 10B:
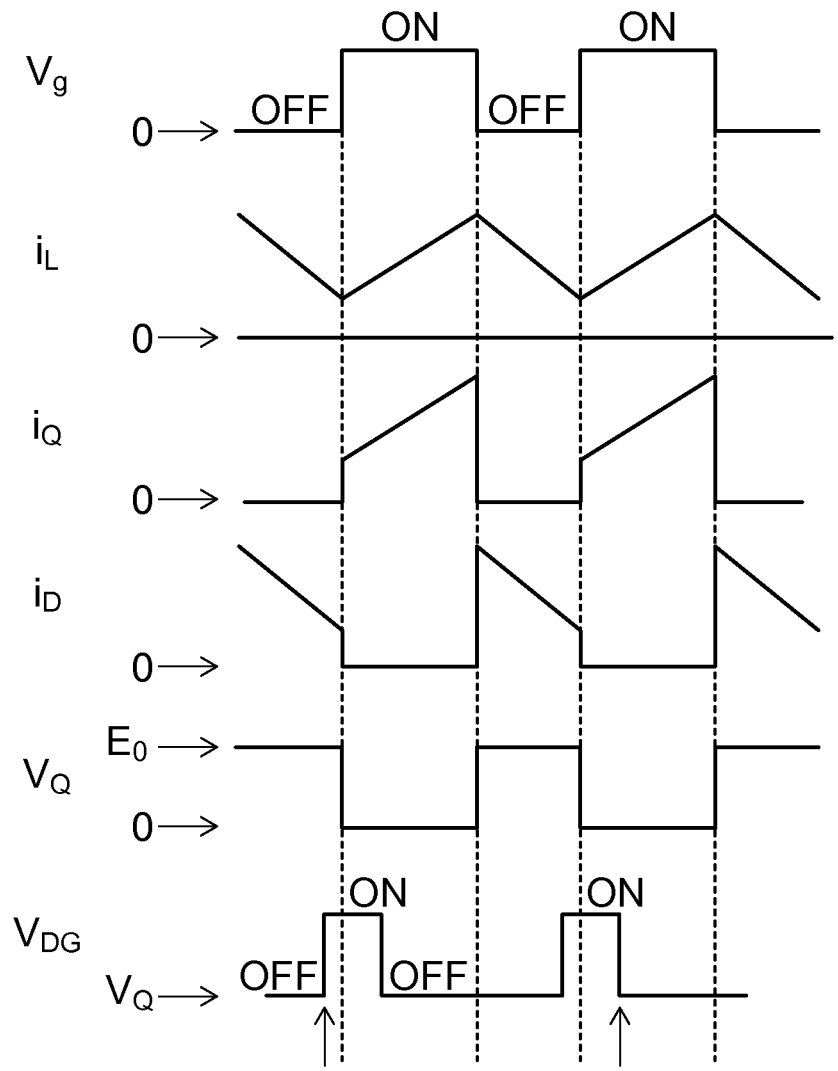
FIG. 10B is a time chart illustrating an operation of the semiconductor device according to the second embodiment.

FIG. 10A is an example of a circuit diagram of the semiconductor device according to the second embodiment, and FIG. 10B is a time chart illustrating an operation of the semiconductor device according to the second embodiment.

A booster circuit is illustrated in FIG. 10A as an example. The semiconductor device 2A is used as an FWD. FIG. 10A is a simple booster circuit, but by connecting a separate IGBT in parallel with the FWD and connecting a separate FWD in parallel with the IGBT, a bidirectional converter can be configured. The driver of the IGBT described above is not for the IGBT illustrated in FIG. 10A but refers to a driver of an IGBT (not illustrated) connected in parallel with the semiconductor device 2A.

$V_g$ and $V_Q$ illustrated in FIG. 10B are the voltages illustrated in FIG. 10A, and $i_L$, $i_Q$, and $I_D$ are the currents illustrated in FIG. 10A. Note that $V_{DG}$ is a voltage of the electrode 50 of the semiconductor device 2A. The voltage of the electrode 50 uses the anode electrode 11 as a standard.

As illustrated in the lowermost time chart, in the second embodiment, immediately before the IGBT is turned ON, that is, immediately before the semiconductor device 2A is turned OFF, a potential for forming the channel region 21ch is supplied to the electrode 50. By this, the semiconductor device 2A can be switched at a high speed. Moreover, after the recovery operation of the semiconductor device 2A is finished, the electrode 50 is turned OFF. Here, a timing of turning OFF the electrode 50 may be any timing in a period when the semiconductor device 2A is turned OFF and is sufficient if at a time when or before the semiconductor device 2A is turned ON. A width of the timing exists because, as described above, the electric field can be applied in the OFF state and the breakdown voltage can be had even in the switching state or the static OFF state due to the embodiment having the semiconductor region 31 that is the p-type high-concentration layer; this is disclosed for the first time in the embodiment. By this, a diode whose ON voltage is low and with little switching loss can be formed. Here, one characteristic of the embodiment is that if the timing of turning OFF the electrode 50 is made to be immediately after the recovery operation of the semiconductor device 2A is finished, the diode with the low ON voltage can be realized because a high-speed recovery operation is realized and the channel region 21ch disappears during conduction.

(Variation of the Second Embodiment)

FIG. 11 is a schematic cross-sectional view illustrating a semiconductor device according to a variation of the second embodiment.

In a semiconductor device 2B illustrated in FIG. 11, the semiconductor region 31 extends continuously in the Y-direction and is in contact with the adjacent insulating film 51. Here, the semiconductor region 31 is thinned out in the X-direction (not illustrated). By this, electrons flow into the anode electrode 11 via the channel region 21ch similar to the first embodiment. That is, electrons are less likely to flow into the anode electrode 11 from the semiconductor region 21 directly below the semiconductor region 30 via the semiconductor region 30. Note that there is an advantage where the ON voltage can be reduced because the width of the semiconductor region 31 is larger than the width in the second embodiment. In the semiconductor device 2B as well, both speeding up the recovery speed and improvement of the breakdown tolerance upon recovery, that is, enlarging the safe operation area (SOA), can be achieved.

Third Embodiment

Figure 12A:
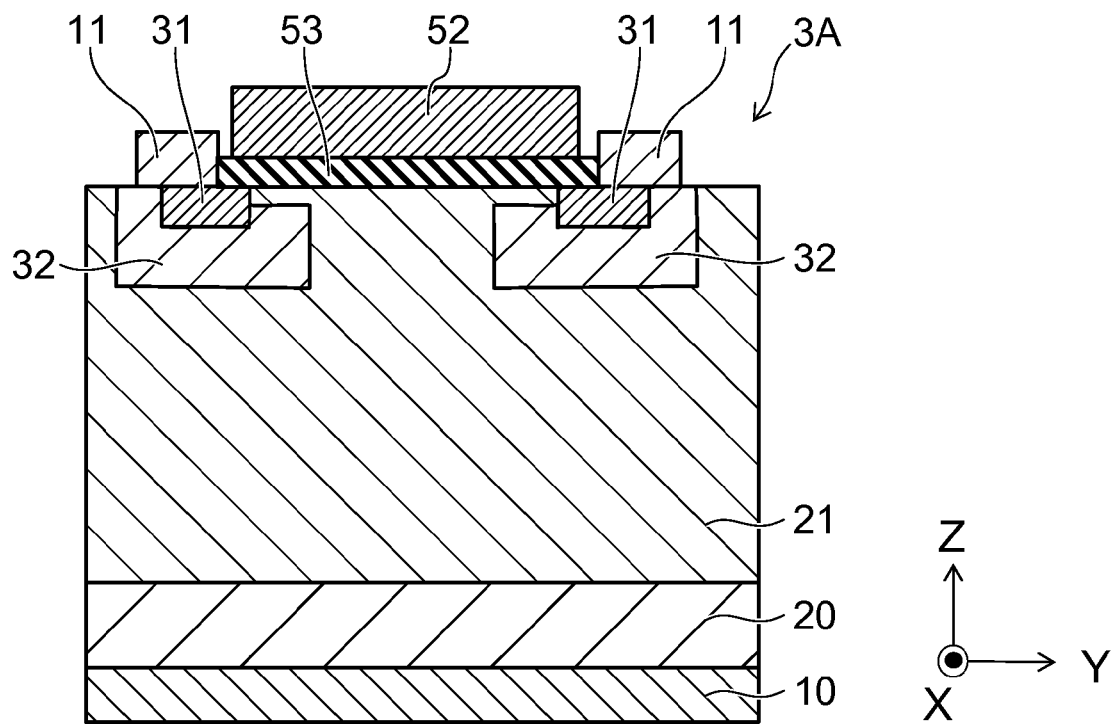
FIG. 12A is a schematic cross-sectional view illustrating a semiconductor device according to a third embodiment.
Figure 12B:
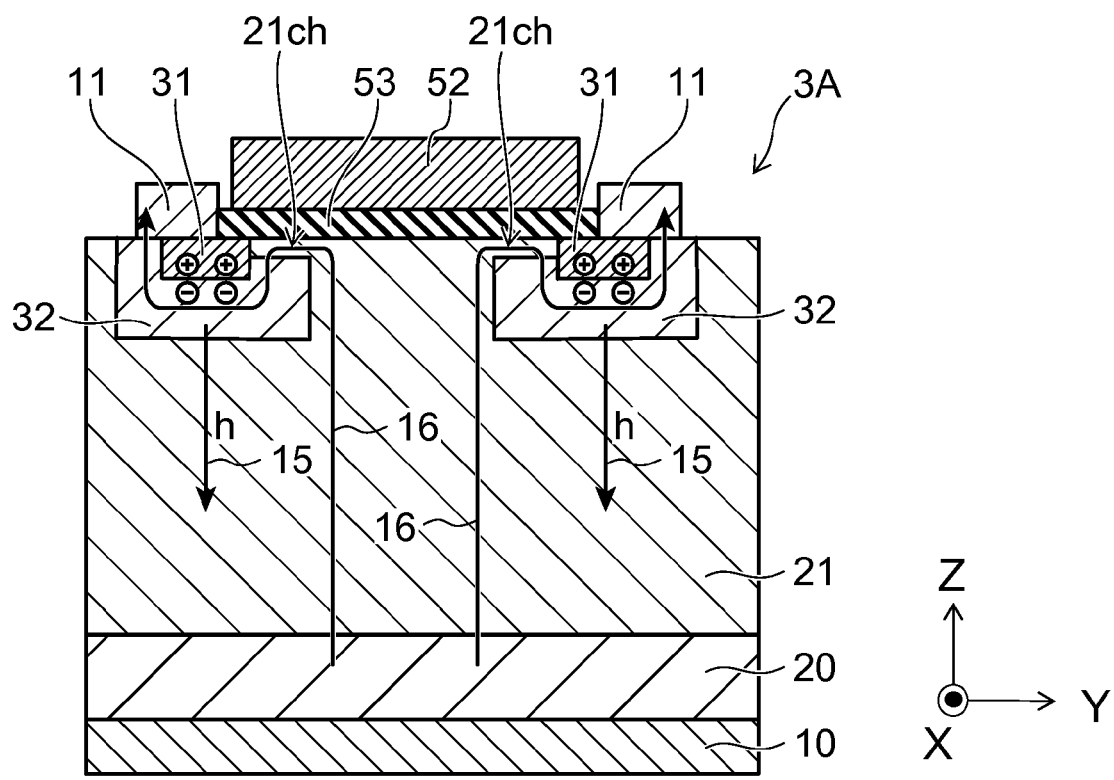
FIG. 12B is a schematic cross-sectional view illustrating an operation thereof.

FIG. 12A is a schematic cross-sectional view illustrating a semiconductor device according to a third embodiment, and FIG. 12B is a schematic cross-sectional view illustrating an operation thereof.

A semiconductor device 3A disposes the electrode 50 described above in a planar form. Moreover, components of the semiconductor device described above can be compounded in the semiconductor device 3A. The semiconductor device 3A illustrated in FIG. 12A is provided with the cathode electrode 10, the anode electrode 11, an insulating region 53, the semiconductor region 20, and the semiconductor region 21. The semiconductor region 21 is provided between the semiconductor region 20 and the anode electrode 11 and between the semiconductor region 20 and the insulating region 53. The insulating region 53 is lined up on the anode electrode 11 in the Y-direction. The insulating region 53 is in contact with the semiconductor region 21. The insulating region 53 is provided on the semiconductor region 21. The insulating region 53 and the anode electrode 11 are arranged in the Y-direction. The insulating region 53 is in contact with the anode electrode 11. The anode electrode 11 is provided on the semiconductor region 31 and on the semiconductor region 32. The semiconductor region 32 (second semiconductor region) is of the same conductivity type as the semiconductor region 30 described above and has a similar impurity concentration thereto.

The semiconductor region 32 is provided between the semiconductor region 21 and the anode electrode 11 and between the semiconductor region 21 and the insulating region 53. A portion of the semiconductor region 32 is in contact with the anode electrode 11. The channel region 21ch is sandwiched between a portion of the semiconductor region 32 other than this portion and the insulating region 53.

The semiconductor region 31 is provided between the semiconductor region 32 and the anode electrode 11 and between the semiconductor region 32 and the insulating region 53. A portion of the semiconductor region 31 is in contact with the semiconductor region 21. A portion of the semiconductor region 31 other than this portion is in contact with the anode electrode 11. Moreover, the semiconductor device 3A may be provided with an electrode 52 so that the insulating region 53 is sandwiched between the electrode 52 and the semiconductor region 21. Note that the electrode 52 may be connected to the anode electrode 11.

An operation of the semiconductor device 3A is illustrated in FIG. 12B.

In the ON state, the voltage of the forward bias is applied between the cathode and the anode. The electrons (e) arrive directly below the semiconductor region 32 from the semiconductor region 20 via the semiconductor region 21. The channel region 21ch is the n-type. Therefore, the electrons flow to the anode electrode 11 via the channel region 21ch, which has the low potential, rather than crossing over the energy barrier between the channel region 21ch and the semiconductor region 32.

Note that the semiconductor region 32 is in resistive contact or in Schottky contact with the anode electrode 11. Because of this, the junction between the semiconductor region 32 and the anode electrode 11 is not an energy barrier for the electrons (e). By this, the electrons are discharged to the anode electrode 11 via the semiconductor region 32.

That is, the electrons (e) flow into the anode electrode 11 via the semiconductor region 20, the semiconductor region 21, the channel region 21ch, and the semiconductor region 32. By this, the electron current 16 is formed between the cathode and the anode.

In this manner, the junction between the semiconductor region 32 and the anode electrode 11 is not an energy barrier for the electrons (e). However, the junction between the semiconductor region 31, which is the p-type high-concentration layer, and the n-type channel region 21ch is an energy barrier for the electrons (e). Therefore, the electrons (e) that arrive in front of the semiconductor region 31 are less likely to flow into the semiconductor region 31. After this, the electrons (e) move in the horizontal direction below the semiconductor region 31, that is, the direction approximately parallel to the Y-direction.

By this horizontal direction movement of the electrons (e), the voltage drop occurs below the semiconductor region 31. By this, the semiconductor region 31 in contact with the anode electrode 11 becomes the positive electrode, and the channel region 21ch and the semiconductor region 32 positioned below the semiconductor region 31 are biased to become negative electrodes relative to the semiconductor region 31.

By this bias, the energy barrier against the holes between the semiconductor region 21 and the semiconductor region 31 and between the semiconductor region 32 and the semiconductor region 31 is lowered below the semiconductor region 31. By this, the holes (h) are injected in the channel region 21ch and the semiconductor region 32 from the semiconductor region 31. The hole current 15 is formed by these injected holes (h).

The hole current 15 increases as the width of the semiconductor region 31 in the Y-direction or in the X-direction, or the contact surface area between the semiconductor region 31 and the anode electrode 11, increases. In other words, the injection amount of the holes from the anode side is adjusted by this width or this contact surface area.

Furthermore, in the semiconductor device 3A, the electrons are less likely to flow to the anode electrode 11 from the semiconductor region 21 directly below the semiconductor region 32 via the semiconductor region 32. Therefore, hole injection from the semiconductor region 32 is reliably suppressed. Moreover, during reverse bias application, in the channel region 21ch, the depletion layer spreads from the junction of the semiconductor region 32 and the channel region 21ch, the junction of the semiconductor region 31 and the channel region 21ch, and the junction of the insulating region 53 and the channel region 21ch as the starting points. Because of this, the channel region 21ch is completely depleted. Therefore, in the semiconductor device 3A, the reverse current is reliably suppressed when the reverse bias is applied. Moreover, when a negative potential relative to the anode electrode 11 is applied on the electrode 52, the depletion layer in the channel region 21ch spreads even more easily.

In this manner, according to the semiconductor device 3A, both speeding up the recovery speed and improvement of the breakdown tolerance upon recovery, that is, enlarging the safe operation area (SOA), can be achieved. Note that the semiconductor device 3A turns the channel region 21ch in the first embodiment and the second embodiment in a horizontal direction and that the variations described above can similarly be applied and exhibit similar effects.

Fourth Embodiment

Figure 13A:
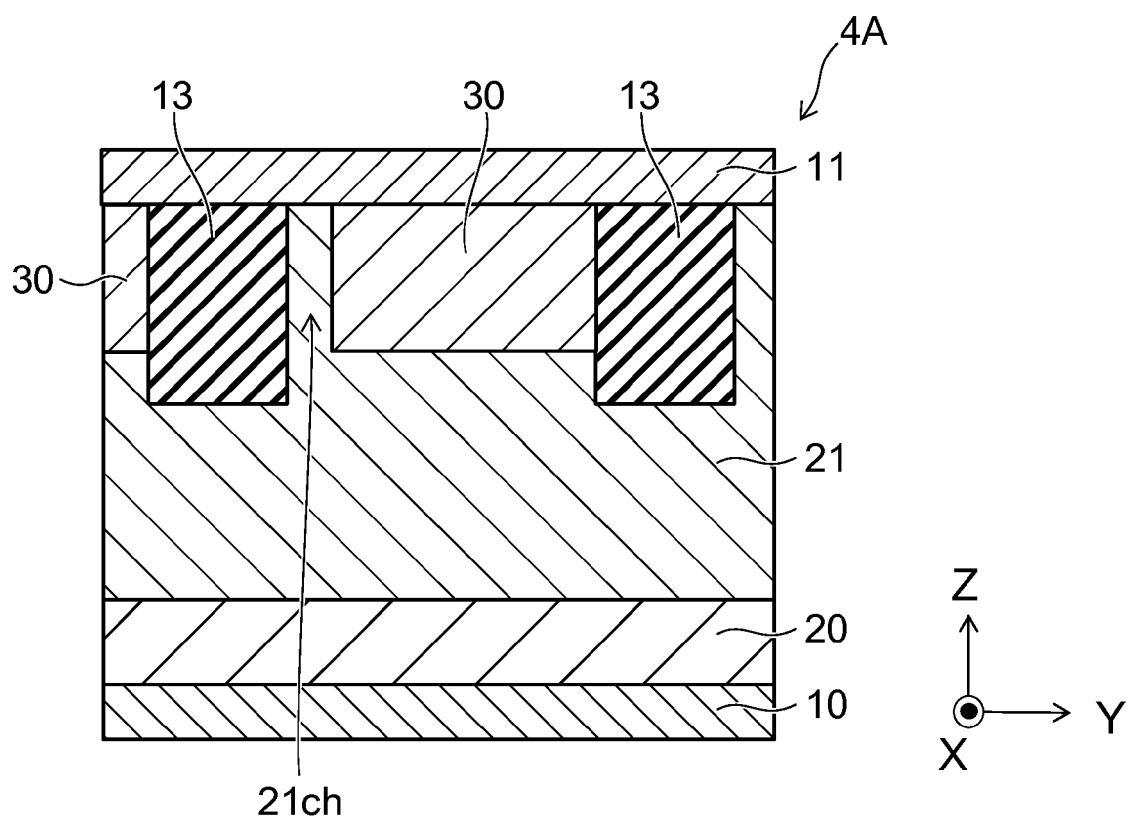
FIGS. 13A and 13B are a schematic cross-sectional views illustrating a semiconductor device according to a fourth embodiment.
Figure 13B:
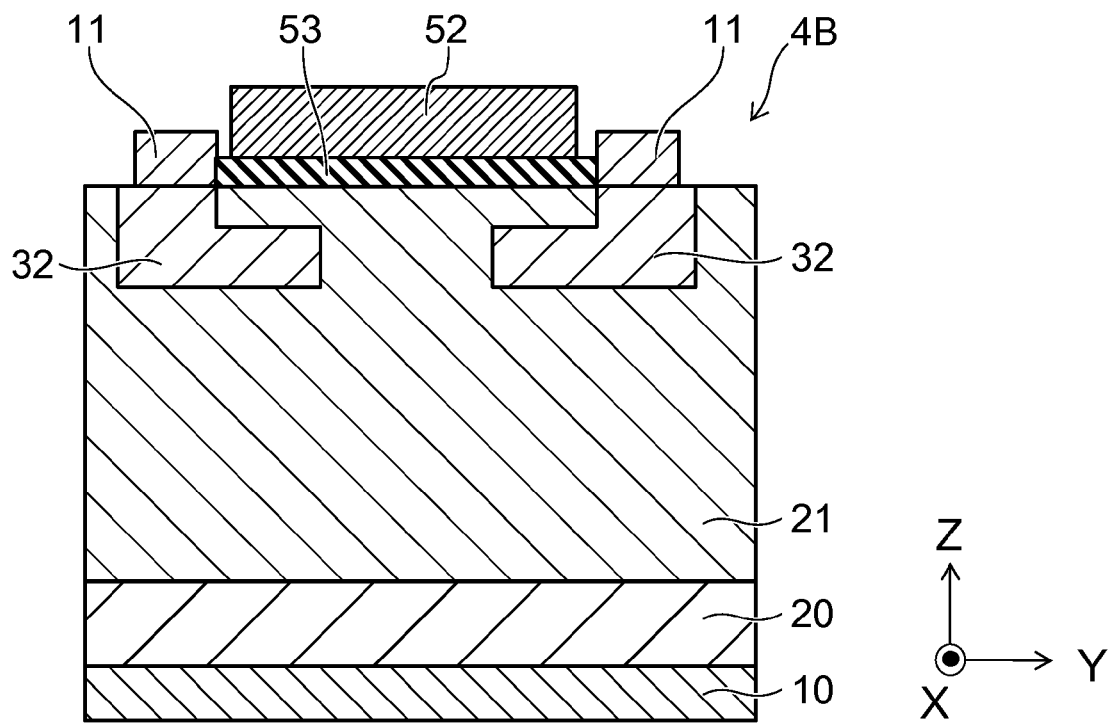

FIGS. 13A and 13B are schematic cross-sectional views illustrating a semiconductor device according to a fourth embodiment.

A semiconductor device 4A illustrated in FIG. 13A has a structure where the semiconductor region 31 is removed from a structure of the semiconductor device 1A described above.

In the semiconductor device 4A, because the semiconductor region 31 is removed, during forward bias application, hole injection from the anode side is further suppressed. Moreover, because the width of the channel region 21 in the Y-direction is sufficiently narrow, is, for example, 1 μm or less as an example of a narrowest width, the channel region 21ch is completely depleted from the junction of the semiconductor region 30 and the channel region 21ch and the junction of the insulating region 13 and the channel region 21ch as the starting point, during reverse bias application. Therefore, in the semiconductor device 4A, the reverse current is reliably suppressed when the reverse bias is applied. Therefore, in the semiconductor device 4A as well, both speeding up the recovery speed and improvement of the breakdown tolerance upon recovery, that is, enlarging the safe operation region, can be achieved.

In a semiconductor device 4B illustrated in FIG. 13B, the semiconductor region 31 is removed from the structure of the semiconductor device 3A described above. In the semiconductor device 4B as well, both speeding up the recovery speed and improvement of the breakdown tolerance upon recovery, that is, enlarging the safe operation region can be achieved.

Fifth Embodiment

Figure 14A:
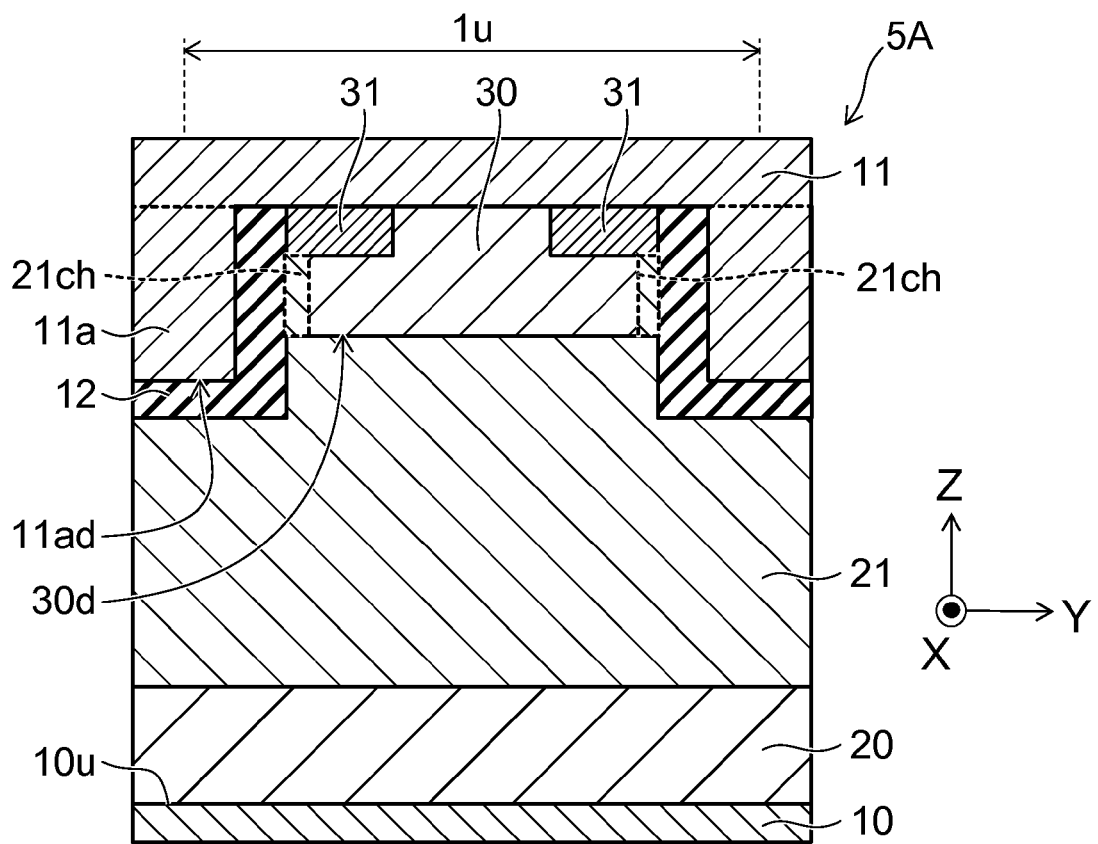
FIG. 14A is a schematic cross-sectional view showing a semiconductor device according to a fifth embodiment.
Figure 14B:
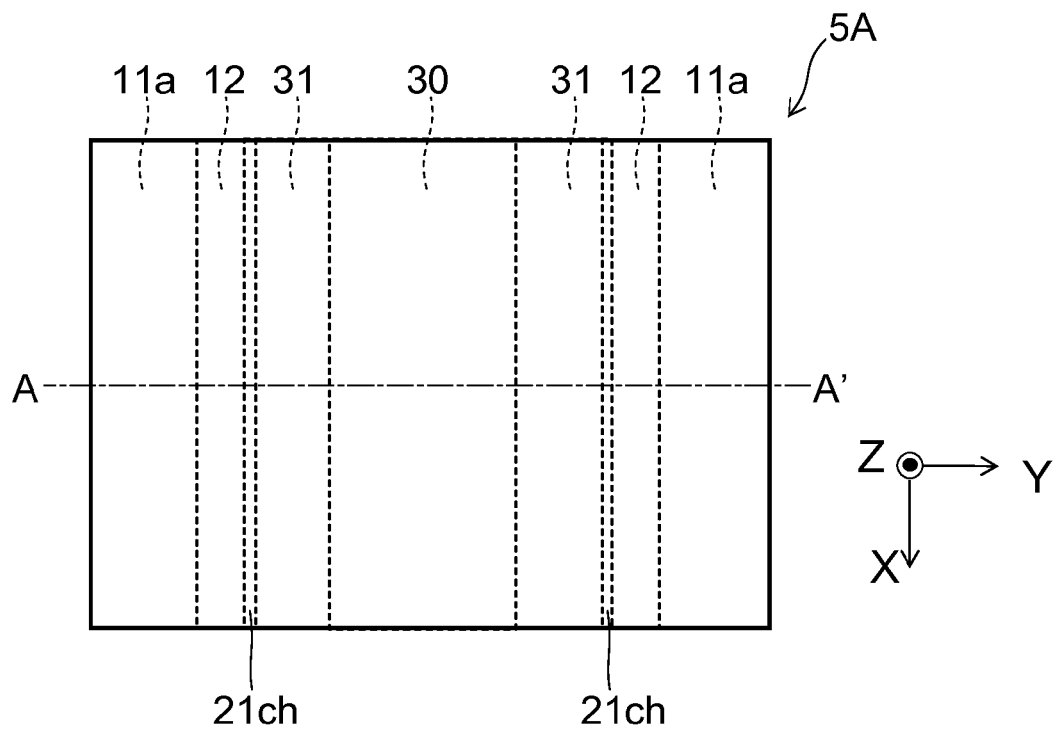
FIG. 14B is a schematic plan view showing the semiconductor device according to the fifth embodiment.

FIG. 14A is a schematic cross-sectional view illustrating a semiconductor device according to the fifth embodiment, and FIG. 14B is a schematic plan view illustrating the semiconductor device according to the fifth embodiment.

The A-A' cross section of FIG. 14B is illustrated in FIG. 14A.

In a semiconductor device 5A according to the fifth embodiment, the first semiconductor region (semiconductor region 20 and semiconductor region 21) is provided between the cathode electrode 10 and the anode electrode 11. The semiconductor region 20 is in contact with the cathode electrode 10. The semiconductor region 30 is provided between the semiconductor region 21 and the anode electrode 11.

The connection region 11a is connected to the anode electrode 11. The connection region 11a extends from a side of the anode electrode 11 to a side of the semiconductor region 21. A distance between the connection region 11a and the cathode electrode 10 may be set shorter than a distance between the semiconductor region 30 and the cathode electrode 10. For example, a distance between a lower portion 11ad of the connection region 11a and an upper portion 10u of the cathode electrode 10 may be set shorter than a distance between a lower portion 30d of the semiconductor region 30 and the upper portion 10u of the cathode electrode 10. Here, the lower portion 30d of the semiconductor region 30 refers to a boundary between the semiconductor region 21 and the semiconductor region 30. At this boundary, an n-type impurity concentration of the semiconductor region 21 is the same as a p-type impurity concentration of the semiconductor region 30, and the boundary is configured as a so called pn-junction.

The semiconductor region 31 is provided between the anode electrode 11 and the semiconductor region 30. The semiconductor region 31 is in contact with the anode electrode 11 and the insulating region (insulating film) 12. The insulating region 12 is provided between the connection region 11a and the semiconductor region 21, between the connection region 11a and the semiconductor region 30, and between the connection region 11a and the semiconductor region 31. Here, as described below, an n-type inversion layer (n-type sixth semiconductor region) is formed along the insulating region 12 in the semiconductor region 30. In the semiconductor device 1A of the first embodiment, the n-type impurity is introduced beside the semiconductor region 30, and the channel region 21ch is added beside the semiconductor region 30. On the other hand, in the semiconductor device 5A, the channel region 21ch is substantially formed between the semiconductor region 30 and the insulating region 12 regardless of the n-type impurity introduction.

An operation of the semiconductor device 5A according to the fifth embodiment will be described.

In the semiconductor device 5A, in the ON state, a potential applied to the anode electrode 11 is higher than a potential applied to the cathode electrode 10. For example, a negative potential is applied to the cathode electrode 10, and a positive potential is applied to the anode electrode 11. Because the anode electrode 11 is in contact with the connection region 11a, the potential at the connection region 11a is positive.

The n-type inversion layer is formed along the insulating region 12 in the semiconductor region 30, and the channel region 21ch is substantially formed between the semiconductor region 30 and the insulating region 12. That is, the semiconductor device 5A has substantially the same structure as the semiconductor device 1A.

This channel region 21ch is formed more reliably, for example, in the case where positive charges exist inside the insulating region 12 or at an interface between the insulating region 12 and the semiconductor region 30 or in the case where the impurity concentration of the semiconductor region 30 is low.

Therefore, in the semiconductor device 5A as well, both speeding up the recovery speed and improvement of the breakdown tolerance upon recovery, that is, enlarging the safe operation region can be achieved. Note that in the semiconductor device 5A, the semiconductor region 31 may be divided into a plurality of regions 31a, and each of the plurality of regions 31a may be arranged in the X-direction.

In the semiconductor device 5A, it is unnecessary to provide the electrode 50, to control this electrode 50, and to form the channel region 21ch. That is, the semiconductor device 5A is configured as a diode that the channel region 21ch being the n-type inversion layer is formed along the insulating region 12 in the semiconductor region 30.

(Variation of the Fifth Embodiment)

Figure 15:
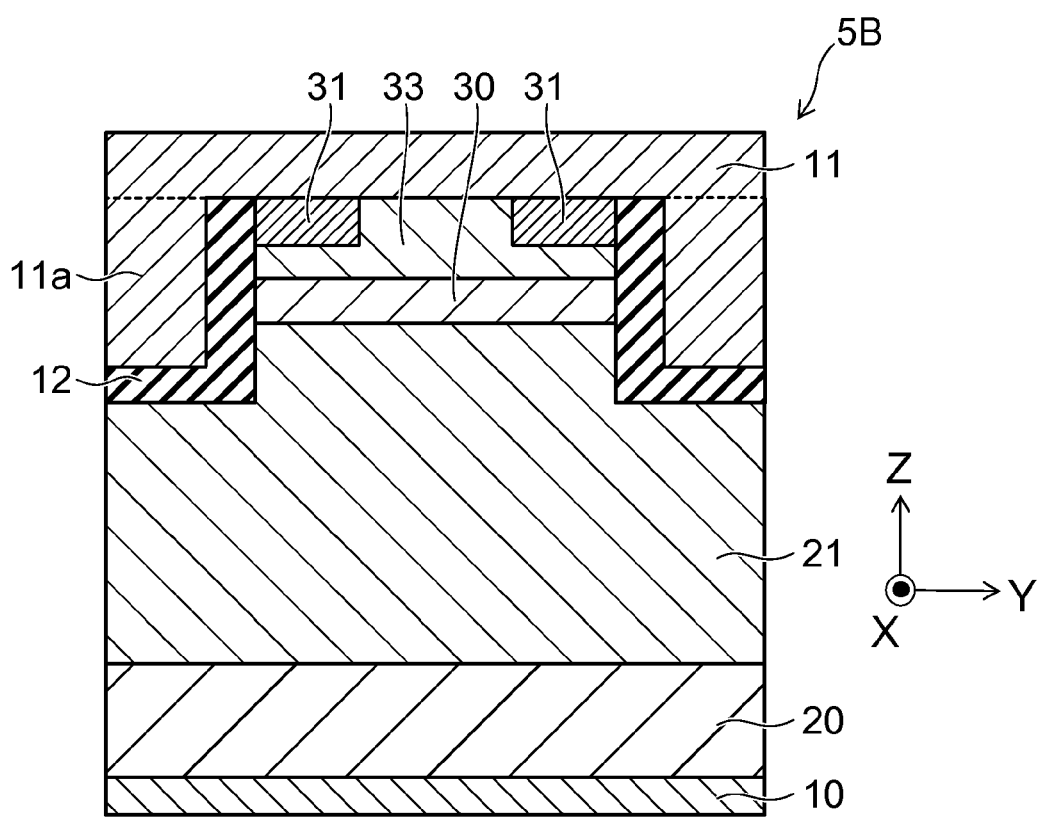
FIG. 15 is a schematic cross-sectional view showing a semiconductor device according to a variation of the fifth embodiment.

FIG. 15 is a schematic cross-sectional view illustrating a semiconductor device according to a variation of the fifth embodiment.

In a semiconductor device 5B, a p-type semiconductor region 33 (fifth semiconductor region) is included. The semiconductor device 5B also has the configuration of the semiconductor device 5A. The semiconductor region 33 is provided between the semiconductor region 30 and the anode electrode 11. The semiconductor region 33 is provided between the semiconductor region 30 and the semiconductor region 31. An impurity concentration in the semiconductor region 33 is greater than an impurity concentration in the semiconductor region 30, and less than an impurity concentration in the semiconductor region 31. In the semiconductor device 5A, the semiconductor region 30 and the semiconductor region 33 are stacked in the Z-direction. Here, the semiconductor region 30 in which the n-type inversion layer can be formed and the semiconductor region 33 in which the n-type inversion layer can not be formed. The impurity concentration in the semiconductor region 33 and the semiconductor region 30 may gradually increase from the semiconductor region 30 toward the semiconductor region 33.

The semiconductor region 33 having the greater impurity concentration than the semiconductor region 30 is provided between the semiconductor region 30 and the anode electrode 11, and thereby the breakdown due to the contact of the depletion layer and the anode electrode 11 in recovery can be prevented. That is, the punch-through in the recovery is suppressed. By this, the breakdown voltage of the semiconductor device 5B in the recovery is ensured sufficiently compared with the semiconductor device 5A.

The impurity concentration in the semiconductor region 33 is less than the impurity concentration in the semiconductor region 31. Therefore, the holes are less likely to be injected into the semiconductor region 21 from the semiconductor region 33.

Sixth Embodiment

Figure 16:
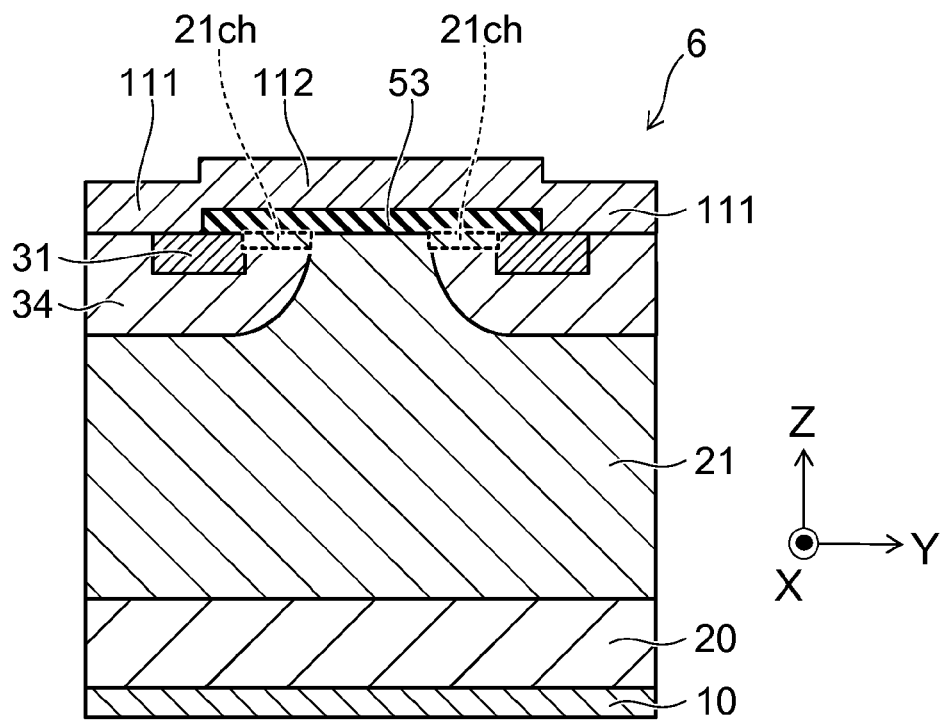
FIG. 16 is a schematic cross-sectional view showing a semiconductor device according to a sixth embodiment.

FIG. 16 is a schematic cross-sectional view illustrating a semiconductor device according to a sixth embodiment.

A semiconductor device 6 has a structure where the electrode 52 of the planar type semiconductor device 3A described above is connected to the anode electrode 11. For example, in the semiconductor device 6, the anode electrode 11 has a first part 111 and a second part 112. The first part 111 corresponds to the anode electrode 11 of the semiconductor device 3A. The second part 112 corresponds to the electrode 52.

The insulating region 53 is lined up on the first part 111. The insulating region 53 is in contact with the semiconductor region 21. The anode electrode 11 is provided on the semiconductor region 31 and on the semiconductor region 34. The semiconductor region 34 has the same conductivity type as the semiconductor region 30 described above and has a similar impurity concentration thereto.

The semiconductor region 34 is provided between the semiconductor region 21 and the anode electrode 11 and between the semiconductor region 21 and the insulating region 53. The semiconductor region 34 is in contact with the anode electrode 11. The semiconductor region 31 is provided on the semiconductor region 34.

The semiconductor region 31 is provided between the semiconductor region 34 and the anode electrode 11 and between the semiconductor region 34 and the insulating region 53. A portion of the semiconductor region 31 is in contact with the anode electrode 11. The second part 112 of the anode electrode 11 is in contact with the first part 111 of the anode electrode 11. The second part 112 and the semiconductor region 21 sandwich the insulating region 53. Here, the n-type inversion layer is formed along the insulating region 53 in the semiconductor region 34. In the semiconductor device 3A of the third embodiment, the n-type impurity is introduced beside the semiconductor region 32, and the channel region 21ch is added beside the semiconductor region 32. On the other hand, in the semiconductor device 6, regardless of the impurity introduction, the channel region 21ch is substantially formed between the semiconductor region 34 and the insulating region 53.

In the semiconductor device 6, in the ON state, a potential applied to the anode electrode 11 is higher than a potential applied to the cathode electrode 10. For example, a negative potential is applied to the cathode electrode 10, and a positive potential is applied to the anode electrode 11.

In the semiconductor region 34, the n-type inversion layer is formed along the insulating region 53, and thus the channel region 21ch is substantially formed between the semiconductor region 34 and the insulating region 53. That is, the semiconductor device 6 has substantially the same structure as the semiconductor device 3A.

The channel region 21ch is formed more reliably, for example, in the case where positive charges exist inside the insulating region 53 or at an interface between the insulating region 53 and the semiconductor region 34 or in the case where the impurity concentration of the semiconductor region 34 is low.

Therefore, in the semiconductor device 6 as well, both speeding up the recovery speed and improvement of the breakdown tolerance upon recovery, that is, enlarging the safe operation region can be achieved. In the semiconductor device 6, it is unnecessary to control the gate electrode, and to form the channel region 21ch. That is, the semiconductor device 6 is configured as a diode that the channel region 21ch being the n-type inversion layer is formed along the insulating region 53 in the semiconductor region 34.

Seventh Embodiment

The width of the channel region 21ch described above may be not more than 1 μm, thus the width may be narrow. This narrow region possibly changes from the n-type region to the p-type region in the manufacturing process because of diffusion of the p-type impurity from the semiconductor region 31 with a high-concentration. According to the seventh embodiment, this possibility can be surely prevented.

Figure 17A:
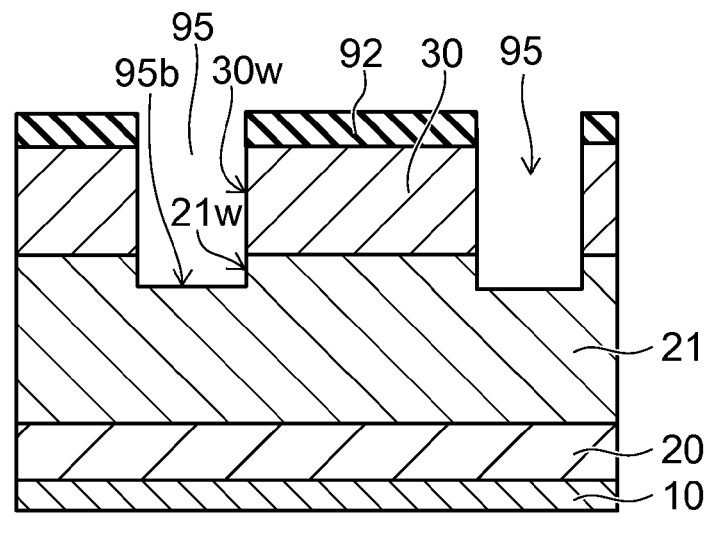
FIG. 17A to FIG. 17C are schematic cross-sectional views showing an example of a manufacturing process of a semiconductor device according to a first example of a seventh embodiment.
Figure 17B:
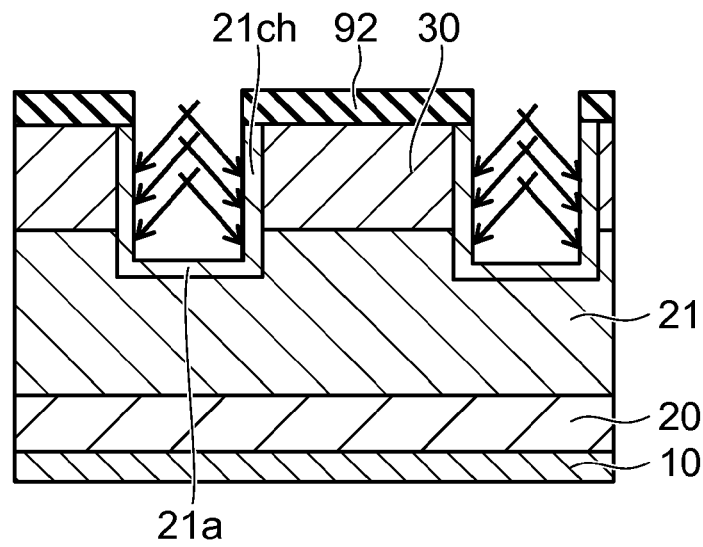
Figure 17C:
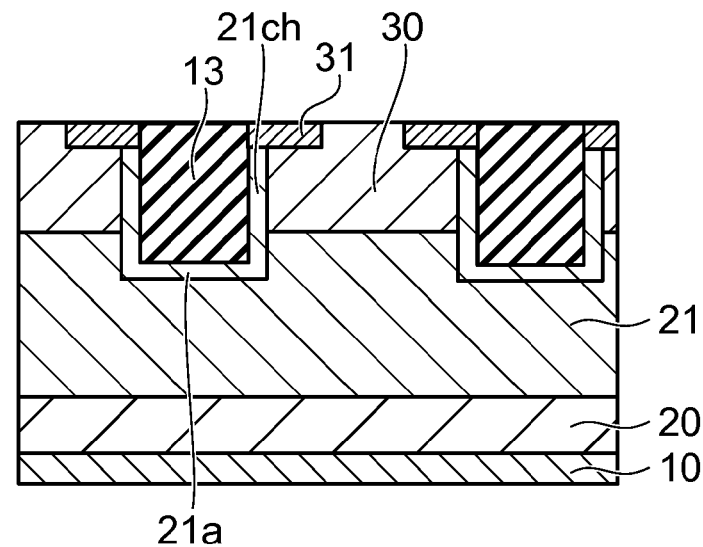

FIG. 17A to FIG. 17C are schematic cross-sectional views illustrating an example of a manufacturing process of a semiconductor device according to a first example of a seventh embodiment.

For example, as illustrated in FIG. 17A, a mask pattern 92 is formed on the semiconductor region 30, and the semiconductor region 30 exposed from the mask pattern 92 is removed by RIE (Reactive Ion Etching) or the like. By this, a trench 95 is formed in the semiconductor region 30. This RIE removes a portion of the semiconductor region 21 as well, and the semiconductor region 21 is exposed in a trench bottom 95b.

Subsequently, the n-type impurity is implanted into a side wall 30w of the semiconductor region 30, a side wall 21w of the semiconductor region 21, and the trench bottom 95b (hereinafter, referred to as trench inner wall) by ion implantation. This state is illustrated in FIG. 17B.

In the first example of the seventh embodiment, the so called oblique implantation is introduced with a prescribed angle from a vertical direction to a wafer surface. This oblique ion implantation implants the n-type impurity into the trench inner wall. In FIG. 17B, a direction of the implanted n-type impurity is illustrated by arrows. In the first example of the seventh embodiment, the ion implantation is performed until the side wall 30w of the semiconductor region 30 becomes the n-type region. After that, heat treatment is performed as necessary.

By this, the channel region 21ch in contact with the semiconductor region 30 is formed beside the semiconductor region 30. Furthermore, an n-type region 21a with an n-type impurity high-concentration is formed on the surface of the semiconductor region 21 exposed in the trench bottom 95b.

After this, as illustrated in FIG. 17C, the semiconductor region 31 is formed selectively on the channel region 21ch and on the semiconductor region 30, for example, by ion implantation. Here, in a region for forming the semiconductor region 31, the p-type impurity is implanted until a conductivity type of the n-type channel region 21ch inverts to the p-type again. Furthermore, the insulating region 13 is formed in the trench 95.

In the first example of the seventh embodiment, even if the p-type impurity elements diffuse to the channel region 21ch side from the semiconductor region 31 or the semiconductor region 30, the n-type impurity is implanted into the channel region 21ch in the degree of amount that the channel region 21ch does not change to the p-type region. Furthermore, because the semiconductor region 31 with a high-concentration is formed after formation of the channel region 21ch, the channel region 21ch is less likely to be influenced by so called thermal history of the semiconductor region 31. Therefore, the channel region 21ch is surely formed.

Figure 18:
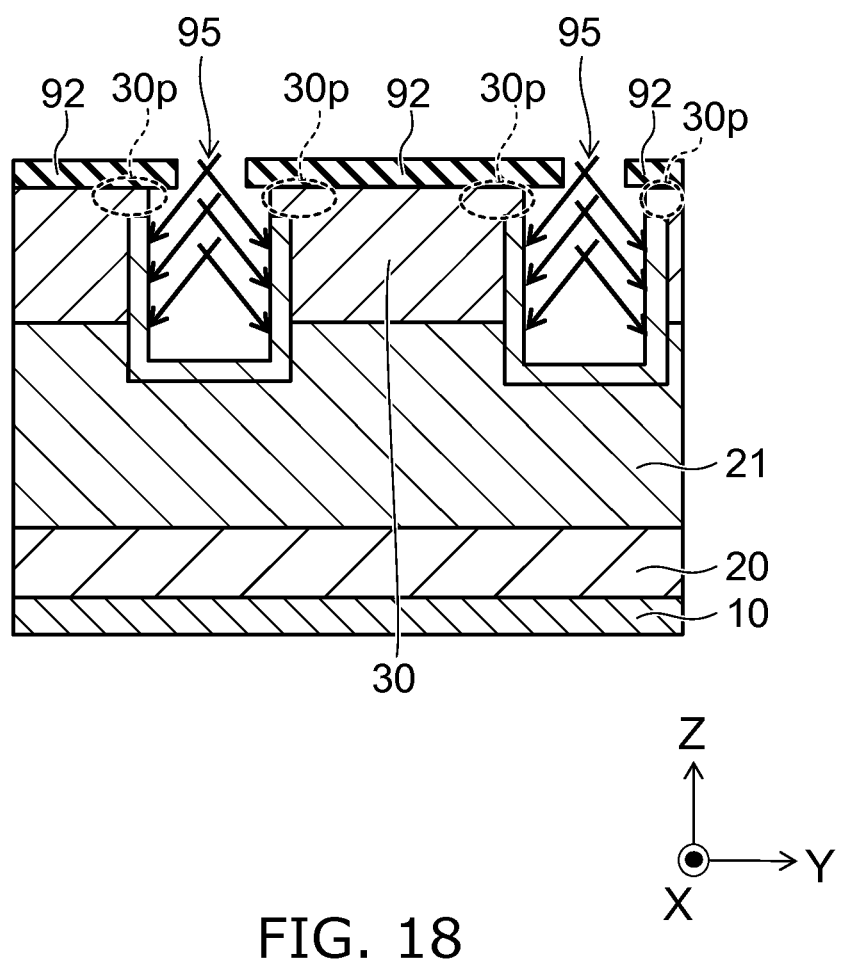
FIG. 18 is a schematic cross-sectional view illustrating an example of a manufacturing process of a semiconductor device according to a second example of the seventh embodiment.

FIG. 18 is a schematic cross-sectional view illustrating an example of a manufacturing process of a semiconductor device according to a second example of the seventh embodiment.

In a second example of the seventh embodiment, the mask pattern 92 when ion implanting the n-type impurity into the trench 95 blocks a portion of the trench 95. That is, the mask pattern 92 is in eaves configuration as viewed from the trench bottom 95b.

The oblique implantation of the n-type impurity into the trench inner wall is performed in this state, and thus the channel region 21ch is formed. Furthermore, the n-type impurity is less likely to be implanted into the semiconductor region 30 (region 30p illustrated by arrows) in the proximity of the mask pattern 92 by shielding of the mask pattern 92. That is, the conductivity type of the semiconductor region 30 illustrated by the arrows 30p keeps the p-type selectively after the formation of the channel region 21ch. As a result, when forming the $p^+$-type semiconductor region 31, it is unnecessary to invert the conductivity type of the n-type channel region 21ch to the p-type again in the region for forming the semiconductor region 31.

In this manner, according to the second example of the seventh embodiment, the channel region 21ch is surely formed. Furthermore, when forming the $p^+$-type semiconductor region 31, the ion implantation to invert the n-type layer to the p-type layer again becomes unnecessary. That is, controllability of forming the p+-type semiconductor region 31 is increased.

Figure 19A:
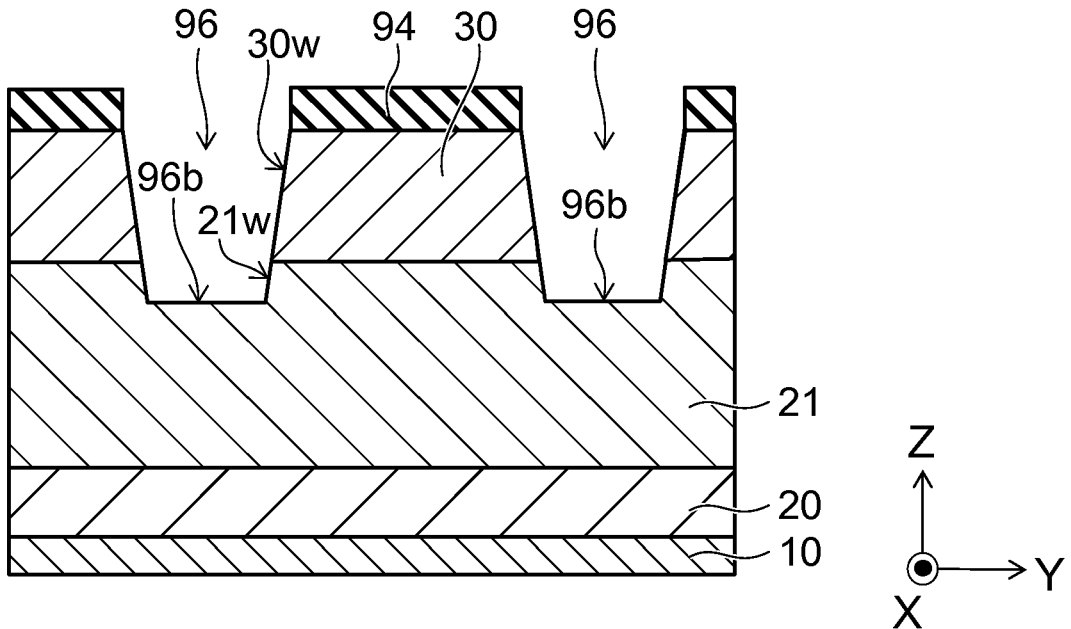
FIG. 19A to FIG. 19B are schematic cross-sectional views showing an example of a manufacturing process of a semiconductor device according to a third example of the seventh embodiment.
Figure 19B:
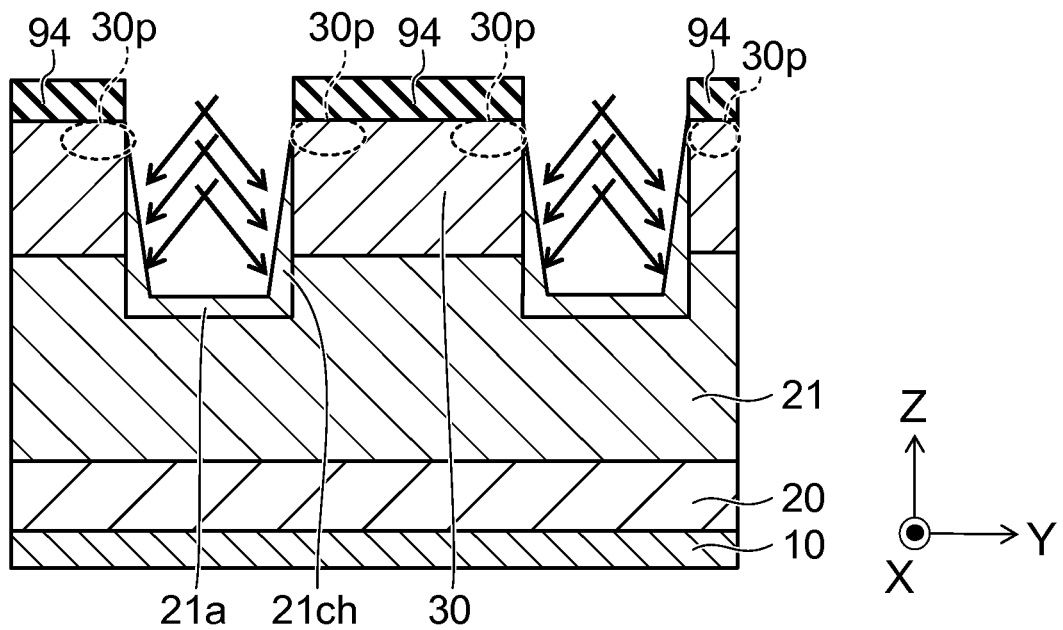

FIG. 19A to FIG. 19B are schematic cross-sectional views illustrating an example of a manufacturing process of a semiconductor device according to a third example of the seventh embodiment.

For example, as illustrated in FIG. 19A, a mask pattern 94 is formed on the semiconductor region 30, and the semiconductor region 30 exposed from the mask pattern 94 is removed by RIE (Reactive Ion Etching) or the like. By this, a trench 96 is formed in the semiconductor region 30. This RIE removes a portion of the semiconductor region 21 as well, and the semiconductor region 21 is exposed in a trench bottom 96b.

In the third example of the seventh embodiment, a taper type trench 96 having a groove width decreasing from the semiconductor region 30 toward the semiconductor region 21 is formed.

Subsequently, the n-type impurity is implanted into a side wall 30w of the semiconductor region 30, a side wall 21w of the semiconductor region 21, and the trench bottom 96b (hereinafter, referred to as trench inner wall) by ion implantation. This state is illustrated in FIG. 19B. In the third example of the seventh embodiment, the so called oblique ion implantation is introduced and the n-type impurity is implanted into the trench inner wall. In FIG. 19B, a direction of the implanted n-type impurity is illustrated by arrows. In the seventh embodiment, the ion implantation is performed until the side wall 30w of the semiconductor region 30 becomes the n-type region. After that, heat treatment is performed as necessary.

By this, the channel region 21ch in contact with the semiconductor region 30 is formed. Furthermore, an n-type region 21a with an n-type impurity high-concentration is formed on the surface of the semiconductor region 21 exposed in the trench bottom 96b.

In the third example of the seventh embodiment, the trench 96 is configured to be in the taper type with a prescribed angle from the vertical direction to the wafer surface. Therefore, the amount of ion implantation into the trench inner wall increases from the semiconductor region 30 (region 30p illustrated by arrows) in the proximity of the mask pattern 92 toward the trench inner wall on a lower side of the region 30p illustrated by the arrows. That is, the conductivity type of the semiconductor region 30 illustrated by the arrows 30p keeps the p-type selectively. As a result, when forming the p+-type semiconductor region 31, it is unnecessary to invert the conductivity type of the n-type channel region 21ch to the p-type again in the region for forming the semiconductor region 31.

In this manner, according to the third example of the seventh embodiment, the channel region 21ch is surely formed. Even if the angle of the ion implantation is small, that is, the ion implantation is performed generally vertically to the semiconductor region 30, the channel region 21ch becomes possible to be surely formed on the trench side wall side. If the ion implantation becomes possible in the generally vertical angle, the channel region 21ch is possible to be formed regardless of disposing the trench.

In the above embodiments, in expressions such as "component A is provided on component B," "on" is sometimes used in the sense that the component A is provided above the component B without the component A contacting the component B, in addition to the sense that the component A is provided on the component B with the component A contacting the component B. Moreover, "component A is provided above component B" is sometimes applied in situations where the component A and the component B are inverted so that the component A is positioned below the component B, and where the component A and the component B are lined up horizontally. This is because a structure of the semiconductor devices does not change before or after rotation when the semiconductor devices according to the embodiments are rotated.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode;
a first semiconductor region of a first conductivity type provided between the first electrode and the second electrode, the first semiconductor region being in contact with the first electrode;
a second semiconductor region of a second conductivity type provided between the first semiconductor region and the second electrode, the second semiconductor region being in contact with the second electrode;
a first insulating region extending in a first direction from the second electrode toward the first electrode, the first insulating region being in contact with the second electrode;
a third semiconductor region of the first conductivity type provided between the second semiconductor region and the first insulating region, the third semiconductor region being in contact with the first semiconductor region and the second semiconductor region, and
a fourth semiconductor region of the second conductivity type, the fourth semiconductor region being in contact with the second electrode, the first insulating region, the second semiconductor region and the third semiconductor region.

2. The device according to claim 1, wherein the third semiconductor region is provided between the first semiconductor region and the second electrode.

3. The device according to claim 1, further comprising: a connection region provided between the second electrode and the insulating region, the connection region being in contact with the second electrode.

4. The device according to claim 1, further comprising:
a third electrode electrically insulated from the second electrode, and the third electrode being provided in the insulating region,
the third semiconductor region being formed by applying a positive bias on the third electrode relative to the first electrode.

5. The device according to claim 1, wherein a distance between the first insulating region and the first electrode in the first direction is shorter than a distance between the second semiconductor region and the first electrode in the first direction.

6. The device according to claim 1, wherein an impurity concentration of the fourth semiconductor region is greater than an impurity concentration of the second semiconductor region.

7. The device according to claim 1, further comprising a second insulating region extending in the first direction and being in contact with the second electrode, the first insulating region and the second insulating region being arranged in a second direction, the second direction being perpendicular to the first direction.

8. The device according to claim 7, wherein the fourth semiconductor region is divided into a plurality of regions in a third direction, the plurality of regions are arranged in the third direction, the third direction is perpendicular to the first direction and the second direction.

9. The device according to claim 1, wherein the first insulating region consists of an insulation.

10. The device according to claim 1, wherein the first insulating region includes an insulation and a connection region provided in the insulation.

11. The device according to claim 10, wherein the connection region is connected to the second electrode.

* * * * *